United States Patent
Amano et al.

(10) Patent No.: US 11,309,402 B2
(45) Date of Patent: Apr. 19, 2022

(54) SEMICONDUCTOR DEVICE CONTAINING TUBULAR LINER SPACER FOR LATERAL CONFINEMENT OF SELF-ALIGNED SILICIDE PORTIONS AND METHODS OF FORMING THE SAME

(71) Applicant: SANDISK TECHNOLOGIES LLC, Addison, TX (US)

(72) Inventors: Fumitaka Amano, Yokkaichi (JP); Yosuke Kita, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/809,798

(22) Filed: Mar. 5, 2020

(65) Prior Publication Data
US 2021/0280686 A1    Sep. 9, 2021

(51) Int. Cl.
*H01L 29/66*    (2006.01)
*H01L 29/78*    (2006.01)
*H01L 29/45*    (2006.01)

(52) U.S. Cl.
CPC ............ *H01L 29/665* (2013.01); *H01L 29/45* (2013.01); *H01L 29/66492* (2013.01); *H01L 29/7833* (2013.01)

(58) Field of Classification Search
CPC ... H01L 29/665; H01L 29/45; H01L 29/7833; H01L 29/66492
See application file for complete search history.

(56) References Cited

U.S. PATENT DOCUMENTS

| | | | |
|---|---|---|---|
| 8,847,302 | B2 | 9/2014 | Alsmeier et al. |
| 9,559,117 | B2 | 1/2017 | Pachamuthu et al. |
| 10,256,099 | B1 | 4/2019 | Akaiwa et al. |
| 10,319,635 | B2 | 6/2019 | Nosho et al. |
| 10,355,139 | B2 | 7/2019 | Sharangpani et al. |
| 2003/0098478 | A1 | 5/2003 | Tobben et al. |
| 2004/0256671 | A1 | 12/2004 | Huang et al. |
| 2005/0026380 | A1 | 2/2005 | Kammler et al. |

(Continued)

OTHER PUBLICATIONS

Notification of Transmittal of the International Search Report and Written Opinion of the International Search Authority for International Patent Application No. PCT/US2020/038455, dated Dec. 2, 2020, 11 pages.

*Primary Examiner* — Syed I Gheyas
(74) *Attorney, Agent, or Firm* — The Marbury Law Group PLLC

(57) ABSTRACT

A semiconductor structure includes a semiconductor channel of a first conductivity type located between a first and second active regions having a doping of a second conductivity type that is opposite of the first conductivity type, a gate stack structure that overlies the semiconductor channel, and includes a gate dielectric and a gate electrode, a first metal-semiconductor alloy portion embedded in the first active region, and a first composite contact via structure in contact with the first active region and the first metal-semiconductor alloy portion, and contains a first tubular liner spacer including a first annular bottom surface, a first metallic nitride liner contacting an inner sidewall of the first tubular liner spacer and having a bottom surface that is located above a horizontal plane including bottom surface of the first tubular liner spacer, and a first metallic fill material portion embedded in the first metallic nitride liner.

20 Claims, 17 Drawing Sheets

(56) References Cited

U.S. PATENT DOCUMENTS

| | | |
|---|---|---|
| 2006/0024896 A1 | 2/2006 | Huang et al. |
| 2006/0057792 A1 | 3/2006 | Mathew et al. |
| 2006/0068545 A1 | 3/2006 | Goldbach |
| 2006/0099729 A1 | 5/2006 | Yang |
| 2006/0102955 A1 | 5/2006 | Chen et al. |
| 2006/0118829 A1 | 6/2006 | Yang |
| 2006/0246641 A1 | 11/2006 | Kammler et al. |
| 2007/0037336 A1 | 2/2007 | Kwon et al. |
| 2007/0122966 A1 | 5/2007 | Hoentschel et al. |
| 2007/0197009 A1 | 8/2007 | Srivastava et al. |
| 2007/0197011 A1 | 8/2007 | Srivastava et al. |
| 2007/0202653 A1 | 8/2007 | Hoentschel et al. |
| 2007/0254461 A1 | 11/2007 | Wei et al. |
| 2008/0160708 A1 | 7/2008 | Nandakumar et al. |
| 2008/0171414 A1 | 7/2008 | Kim |
| 2008/0185634 A1 | 8/2008 | Li et al. |
| 2008/0203486 A1 | 8/2008 | Wiatr et al. |
| 2008/0246093 A1 | 10/2008 | Yang |
| 2009/0042351 A1 | 2/2009 | Bo et al. |
| 2009/0142895 A1 | 6/2009 | Stephens et al. |
| 2009/0203182 A1 | 8/2009 | Lee et al. |
| 2010/0078735 A1 | 4/2010 | Hoentschel et al. |
| 2010/0109091 A1 | 5/2010 | Griebenow et al. |
| 2010/0171180 A1 | 7/2010 | Zhang et al. |
| 2011/0127614 A1 | 6/2011 | Scheiper et al. |
| 2011/0272765 A1* | 11/2011 | Seo ......................... H01L 29/78 257/410 |
| 2012/0217582 A1 | 8/2012 | Baars et al. |
| 2014/0001529 A1 | 1/2014 | Hsieh et al. |
| 2014/0035010 A1 | 2/2014 | Cai et al. |
| 2015/0311221 A1* | 10/2015 | Huang ............... H01L 21/76843 257/314 |
| 2016/0163875 A1 | 6/2016 | Hsieh et al. |
| 2016/0322374 A1* | 11/2016 | Sano ................ H01L 21/76804 |
| 2018/0151429 A1 | 5/2018 | Wang et al. |
| 2018/0151679 A1 | 5/2018 | Wang et al. |
| 2018/0331118 A1 | 11/2018 | Amano |
| 2018/0366368 A1 | 12/2018 | Chiu et al. |
| 2019/0067436 A1 | 2/2019 | Wu et al. |
| 2019/0097012 A1 | 3/2019 | Hung et al. |
| 2019/0296012 A1* | 9/2019 | Iwata .................. H01L 29/0847 |
| 2020/0006131 A1 | 1/2020 | Shimabukuro et al. |
| 2020/0135871 A1* | 4/2020 | Tsai .................. H01L 21/76831 |

* cited by examiner

SEMICONDUCTOR DEVICE CONTAINING TUBULAR LINER SPACER FOR LATERAL CONFINEMENT OF SELF-ALIGNED SILICIDE PORTIONS AND METHODS OF FORMING THE SAME

FIELD

The present disclosure generally relates to semiconductor devices, and particularly to semiconductor devices including tubular liner spacers for lateral confinement of self-aligned metal-semiconductor alloy portions, such as silicide portions, and methods of manufacturing the same.

BACKGROUND

Semiconductor devices employ contact structures having self-aligned metal semiconductor alloy portions, such as metal silicide portions, in order to provide electrical contact to a small device area.

SUMMARY

According to an aspect of the present disclosure, a semiconductor structure includes a semiconductor channel of a first conductivity type located between a first and second active regions having a doping of a second conductivity type that is opposite of the first conductivity type, a gate stack structure that overlies the semiconductor channel, and includes a gate dielectric and a gate electrode, a first metal-semiconductor alloy portion embedded in the first active region, and a first composite contact via structure in contact with the first active region and the first metal-semiconductor alloy portion, and contains a first tubular liner spacer including a first annular bottom surface, a first metallic nitride liner contacting an inner sidewall of the first tubular liner spacer and having a bottom surface that is located above a horizontal plane including bottom surface of the first tubular liner spacer, and a first metallic fill material portion embedded in the first metallic nitride liner.

According to another aspect of the present disclosure, a method of forming a semiconductor structure is provided, which comprises: forming a first active region on or in a substrate semiconductor layer located in a substrate, wherein the first active region has a doping of an opposite conductivity type than the substrate semiconductor layer; forming a contact-level dielectric layer above the substrate; forming a first contact via cavity extending into the first active region through the contact-level dielectric layer; forming a first tubular liner spacer at a periphery of the first contact via cavity; forming a first metal-semiconductor alloy portion on the first active region at a bottom region of the first contact via cavity; forming a first metallic nitride liner on the first tubular liner spacer and the first metal-semiconductor alloy portion; and forming a first metallic fill material portion in the first metallic nitride liner, wherein the first contact via cavity is filled with a first composite contact via structure including the first tubular liner spacer, the first metal-semiconductor alloy portion, the first metallic nitride liner, and the first metallic fill material portion.

DETAILED DESCRIPTION

Figure 1:
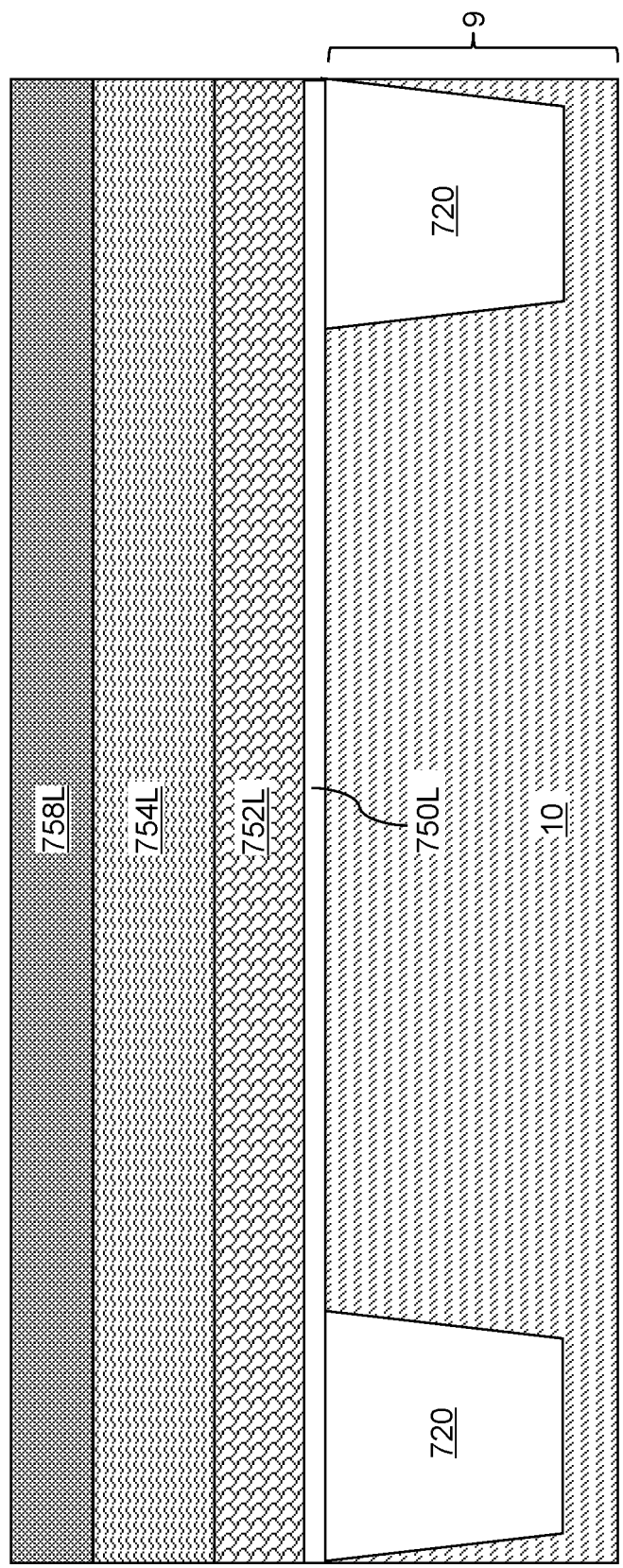
FIG. 1 is a vertical cross-sectional view of a first exemplary structure after formation of a gate dielectric layer, a semiconductor gate electrode portion material layer, a metallic gate electrode portion material layer, and a gate cap dielectric layer according to a first embodiment of the present disclosure.

While a thick silicide portion provides a sufficiently low contact resistance, collateral lateral expansion of the silicide that occurs at a periphery of the thick silicide portion can induce electrical shorts to an adjacent component of a semiconductor device, such as an adjacent gate electrode of a transistor. Thus, providing a low resistance contact structure employing a self-aligned silicide portion is a challenge for small scale semiconductor devices. The embodiments of the present disclosure are directed to semiconductor devices including tubular liner spacers for lateral confinement of self-aligned metal-semiconductor alloy portions, such as silicide portions, which reduce or prevent electrical shorts, and methods of manufacturing the same, the various aspects of which are discussed in detail herebelow.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein. As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

Referring to FIG. 1, a first exemplary structure according to a first embodiment of the present disclosure is provided. The exemplary structure includes a semiconductor substrate 9, which may be, for example, a semiconductor wafer such as a commercially available silicon wafer. Generally, the substrate 9 includes a substrate semiconductor layer 10 which is a semiconductor material layer containing, and/or consisting essentially of, a semiconductor material. The semiconductor material may be at least one elemental semiconductor material (e.g., single crystal silicon), at least one III-V compound semiconductor material, or at least one II-VI compound semiconductor material. Various portions of the substrate semiconductor layer 10 may be doped with p-type dopants or n-type dopants at suitable atomic concentrations. The substrate semiconductor layer 10 can be a top portion of the bulk semiconductor substrate (e.g., a doped well in a silicon wafer). Alternatively, the substrate semiconductor layer 10 may comprise a semiconductor layer formed on a top surface of an insulating, semiconductor or conductive substrate, such as a silicon-on-insulator type substrate.

As used herein, a "semiconducting material" refers to a material having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from $1.0$ S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

The substrate semiconductor layer 10 can include a single crystalline semiconductor material such as single crystalline silicon. The illustrated portion of the substrate semiconductor layer 10 can have a doping of a first conductively type, which may be p-type or n-type. The atomic concentration of first conductivity type dopants in the substrate semiconductor layer 10 can be in a range from $1.0 \times 10^{14}/cm^3$ to $1.0 \times 10^{17}/cm^3$, although lesser and greater atomic concentrations can also be employed.

Shallow trench isolation structures 720 can be formed in upper portions of the substrate semiconductor layer 10 to provide electrical isolation between neighboring devices. For example, shallow trenches can be formed around each device region that requires electrical isolation from neighboring device regions, and can be filled with a dielectric material such as silicon oxide. Excess portions of the dielectric material can be removed from above the top surface of the substrate semiconductor layer 10 by a planarization process such as chemical mechanical planarization. Remaining portions of the dielectric material in the shallow trenches constitute the shallow trench isolation structures 720. In one embodiment, one of the shallow trench isolation structures 720 can laterally surround a device region such as the device region illustrated in FIG. 1. In one embodiment, an inner periphery of the shallow trench isolation structure 720 that laterally surrounds a device region can have a rectangular shape in a plan view, i.e., a view along a direction perpendicular to the top surface of the substrate semiconductor layer 10. The length of the rectangular shape can be the lateral dimension of a field effect transistor along a channel direction (i.e., a direction along which electrical current flows), and the width of the rectangular shape can be the width of the field effect transistor perpendicular to the channel direction (i.e., a direction along which the gate electrode of the field effect transistor laterally extends).

A gate dielectric layer 750L, at least one gate material layer (752L, 754L), and an optional gate cap dielectric layer 758L can be sequentially formed on the top surface of the substrate semiconductor layer 10. The gate dielectric layer 750L can include any gate dielectric material known in the art. For example, the gate dielectric layer 750L can include a semiconductor oxide layer (such as a silicon oxide layer) formed by thermal oxidation of a surface portion of the substrate semiconductor layer 10 and/or deposition of semiconductor oxide material (such as silicon oxide by thermal decomposition of tetraethylorthosilicate (TEOS)). Alternatively or additionally, the gate dielectric layer 750L can include a dielectric metal oxide layer. Exemplary materials that may be employed for the dielectric metal oxide layer within the gate dielectric layer 750L include, but are not limited to, aluminum oxide, hafnium oxide, zirconium oxide, tantalum oxide, titanium oxide, and lanthanum oxide. The dielectric metal oxide layer may be deposited by atomic layer deposition or chemical vapor deposition. The thickness of the gate dielectric layer 750L can be in a range from 1 nm to 12 nm, such as from 1.5 nm to 6 nm, although lesser and greater thicknesses can also be employed.

The at least one gate material layer (752L, 754L) includes at least one of a semiconductor gate material layer 752L and a metallic gate material layer 754L. The semiconductor gate material layer 752L includes a doped semiconductor material such as doped polysilicon. The semiconductor gate material layer 752L can be deposited by chemical vapor deposition. Dopants can be introduced in the semiconductor gate material layer 752L by in-situ doping or by ion implantation. The thickness of the semiconductor gate material layer 752L can be in a range from 20 nm to 200 nm, although lesser and greater thicknesses can also be employed. The metallic gate material layer 754L includes a metallic gate material such as TiN, TaN, WN, Zr, Al, Ta, Ti, Mo, Sr, V, Sn, W, Er, Ru, Co, Pb, Ni, Re, Ir, Pt, any other metal, an intermetallic alloy, a metal silicide material, or a layer stack thereof. The metallic gate material layer 754L can be deposited by physical vapor deposition (sputtering) and/or by chemical vapor deposition. The thickness of the metallic gate material layer 754L can be in a range from 20 nm to 200 nm, although lesser and greater thicknesses can also be employed. The total thickness of the at least one gate material layer (752L, 754L) can be in a range from 50 nm to 300 nm, although lesser and greater thicknesses can also be employed.

The gate cap dielectric layer 758L includes a dielectric material such as silicon nitride. The gate cap dielectric layer 758L can be deposited by chemical vapor deposition. The thickness of the gate cap dielectric layer 758L can be in a range from 10 nm to 50 nm, although lesser and greater thicknesses can also be employed.

Figure 2:
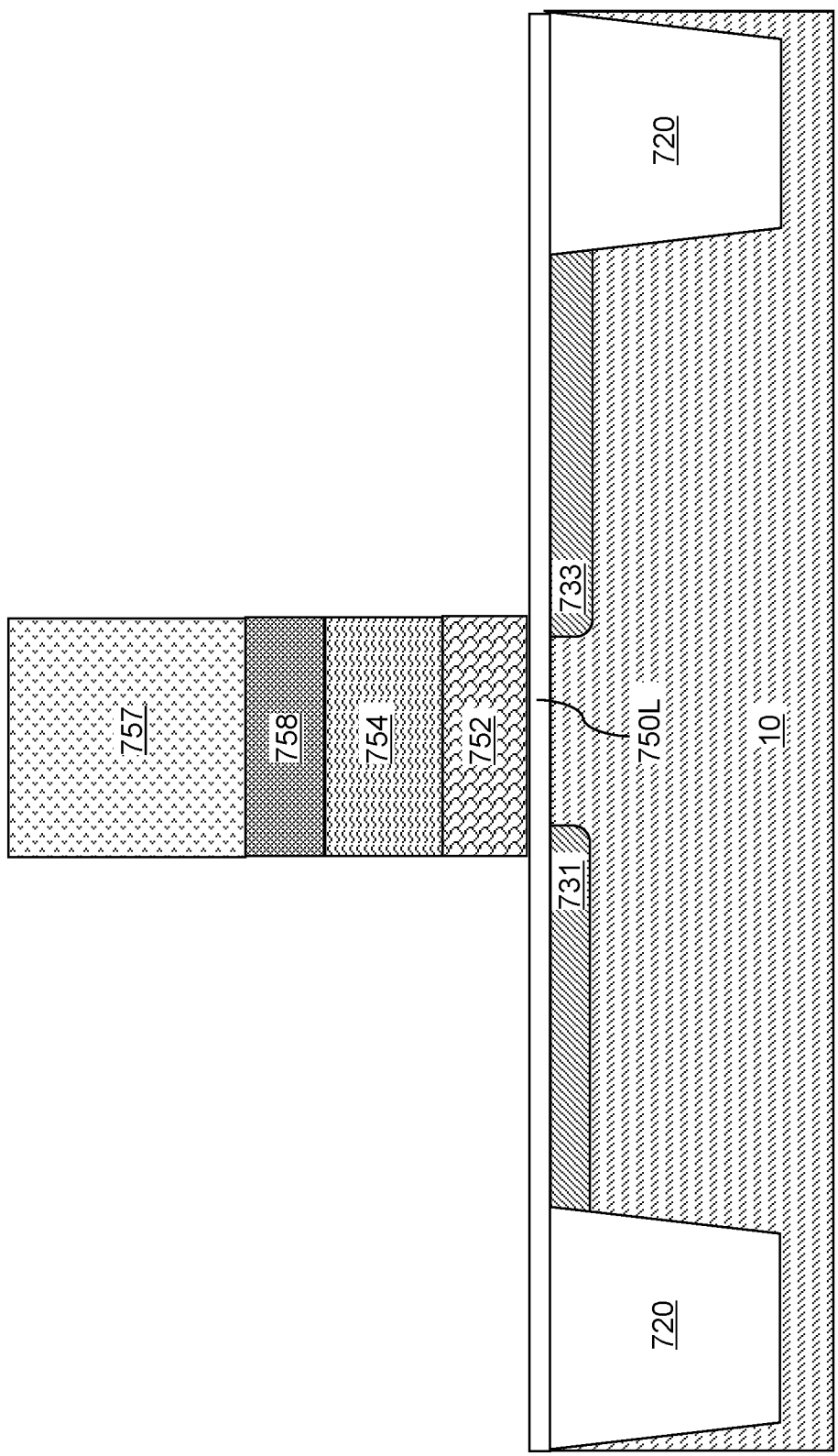
FIG. 2 is a vertical cross-sectional view of the first exemplary structure after formation of a stack of a gate dielectric, a semiconductor gate electrode portion, a metallic gate electrode portion, a gate cap dielectric, and doped extension regions according to the first embodiment of the present disclosure.

Referring to FIG. 2, a photoresist layer 757 can be applied over the stack of the gate dielectric layer 750L, the at least one gate material layer (752L, 754L), and the gate cap dielectric layer 758L, and can be lithographically patterned to cover areas in which gate electrodes are to be subsequently formed. An anisotropic etch process can be performed to etch portions of the at least one gate material layer (752L, 754L) and the gate cap dielectric layer 758L that are not masked by the photoresist layer 757. The anisotropic etch process sequentially etches the materials of the gate cap dielectric layer 758L and the at least one gate material layer (752L, 754L). In one embodiment, a termination portion of the anisotropic etch process can be selective to the material of the gate dielectric layer 750L, and the gate dielectric layer 750L may remain outside the areas that are masked by the photoresist layer 757. Alternatively, unmasked portions of the gate dielectric layer 750L may be removed by the anisotropic etch process or a subsequent isotropic etch process that etches the material(s) of the gate dielectric layer 750L selective to the material of the substrate semiconductor layer 10.

Patterned portions of the gate cap dielectric layer 758L comprise gate cap dielectrics 758, and patterned portions of the at least one gate material layer (752L, 754L) comprise gate electrodes (752, 754). If the at least one gate material layer (752L, 754L) includes a vertical stack of a semiconductor gate material layer 752L and a metallic gate material layer 754L, each gate electrode (752, 754) can include a vertical stack of a semiconductor gate electrode portion 752 and a metallic gate electrode portion 754. Each semiconductor gate electrode portion 752 is a patterned portion of the semiconductor gate material layer 752L, and each metallic gate electrode portion 754 is a patterned portion of the metallic gate material layer 754L.

Doped extension regions (731, 733) having a doping of a second conductivity type can be formed within surface regions of the substrate semiconductor layer 10 by implantation of dopants of the second conductivity type. The second conductivity type is the opposite of the first conductivity type. For example, if the first conductivity type is p-type, the second conductivity type is n-type, and vice versa. The doped extension regions (731, 733) can include a source-side doped extension region 731 (which is also called a source extension region) that is formed on a source side, and a drain-side doped extension region 733 (which is also called a drain extension region) that is formed on a drain side which is the opposite side of the source side with respective to the illustrated gate electrode (752, 754). The energy of the ion implantation process that implants the dopants of the second conductivity type can be selected such that p-n junctions formed between the doped extension regions (731, 733) and the substrate semiconductor layer 10 has a depth in a range from 3 nm to 60 nm, such as from 6 nm to 30 nm, although lesser and greater depths can also be employed. The dose of dopants of the second conductivity type can be selected such that the average atomic concentration of dopants of the second conductivity type in the doped extension regions (731, 733) is in a range from $1.0 \times 10^8/cm^3$ to $1.0 \times 10^{21}/cm^3$, although lesser and greater atomic concentrations can also be employed. The doped extension regions (731, 733) can be formed within surface portions of the substrate semiconductor layer 10 that are not masked by the gate electrode (752, 754), and may have an areal overlap with peripheral portions of gate electrode (752, 754). The photoresist layer 757 can be subsequently removed, for example, by ashing.

Figure 3:
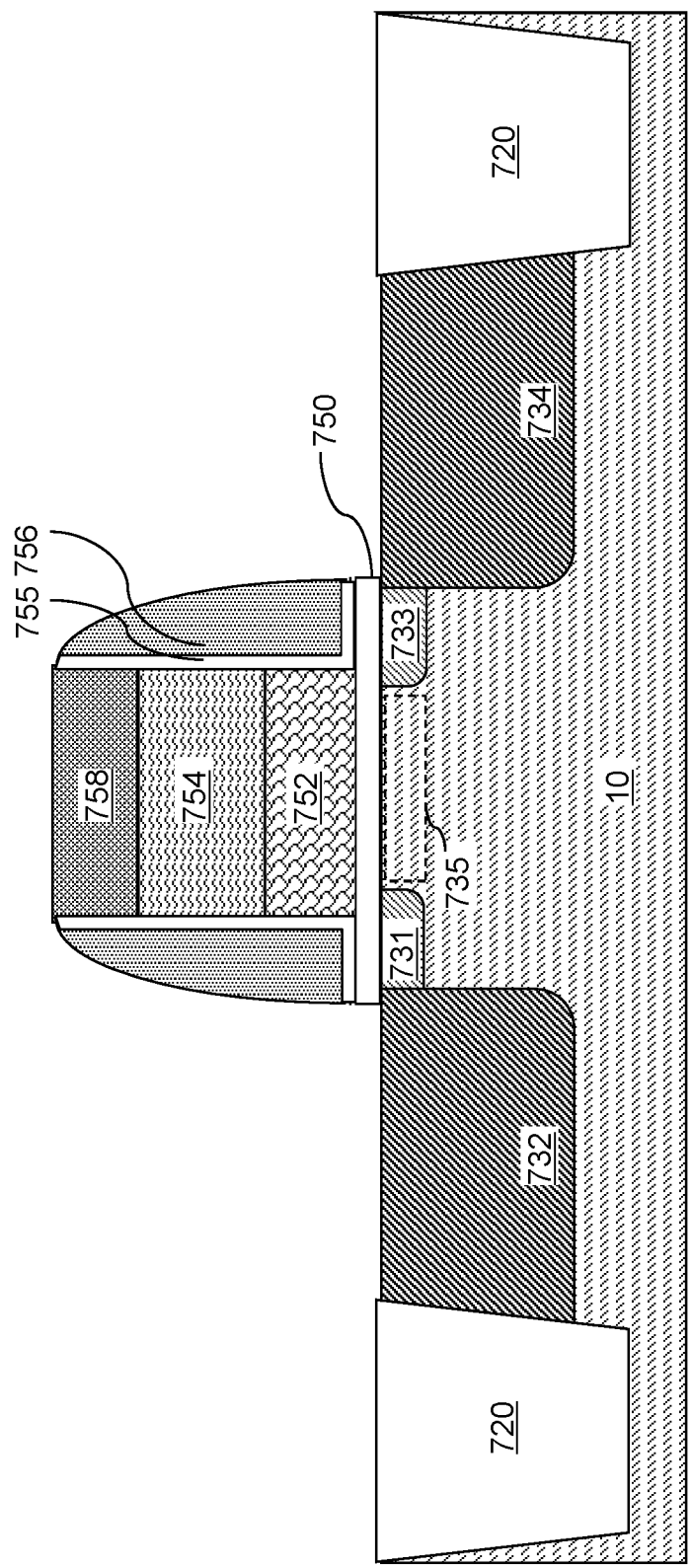
FIG. 3 is a vertical cross-sectional view of the first exemplary structure after formation of dielectric gate spacers and deep active regions according to the first embodiment of the present disclosure.

Referring to FIG. 3, a conformal dielectric gate liner including a first dielectric material such as silicon oxide can be optionally deposited by a conformal deposition process. The conformal dielectric gate liner can have a thickness in a range from 2 nm to 10 nm, although lesser and greater thicknesses can also be employed. A continuous gate spacer dielectric layer including a second dielectric material such as silicon nitride can be subsequently deposited over the conformal dielectric gate liner. The thickness of vertical portions of the continuous gate spacer dielectric layer can be in a range from 5 nm to 50 nm, although lesser and greater thicknesses can also be employed.

An anisotropic sidewall spacer etch process can be performed to remove horizontal portions of the continuous gate spacer dielectric layer and the conformal dielectric gate liner. A remaining portion of the continuous gate spacer dielectric layer includes a dielectric gate spacer 756 that laterally surrounds the illustrated gate electrode (752, 754). A remaining portion of the conformal dielectric gate liner includes a dielectric gate liner 755, which may have an "L-shaped" vertical cross-sectional profile. Portions of the gate dielectric layer 750L that are not covered by a contiguous combination of the gate cap dielectric 758, the dielectric gate liner 755, and the dielectric gate spacer 756 can be removed by a terminal portion of the anisotropic etch process. The anisotropic etch process can stop on the top surface of the substrate semiconductor layer 10. A remaining portion of the gate dielectric layer 750L comprises a gate dielectric 750. A contiguous combination of the gate dielectric 750, the gate electrode (752, 754), the gate cap dielectric 758, the optional dielectric gate liner 755, and the dielectric gate spacer 756 constitutes a gate stack structure (750, 752, 754, 758, 755, 756).

Deep active regions (732, 734) having a doping of the second conductivity type can be formed within surface regions of the substrate semiconductor layer 10 by additional implantation of dopants of the second conductivity type. The gate stack structure (750, 752, 754, 758, 755, 756) is employed as a self-aligned ion implantation mask. The deep active regions (732, 734) can include a deep source region 732 that incorporates a portion of the source-side doped extension region 731, and a deep drain region 734 that incorporates a portion of the drain-side doped extension region 733. The energy of the ion implantation process that implants the dopants of the second conductivity type can be selected such that the p-n junctions formed between the deep active regions (732, 734) and the substrate semiconductor layer 10 has a depth in a range from 30 nm to 300 nm, such as from 60 nm to 150 nm, although lesser and greater depths can also be employed. The dose of dopants of the second conductivity type can be selected such that the average atomic concentration of dopants of the second conductivity type in the deep active regions (732, 734) is in a range from $1.0 \times 10^{19}/cm^3$ to $2.0 \times 10^{21}/cm^3$, although lesser and greater atomic concentrations can also be employed. The average dopant concentration of the dopants of the second conductivity in the deep active regions (732, 734) can be higher than the average dopant concentration of the dopants of the second conductivity in the doped extension regions (731, 733). Remaining portions of the doped extension regions (731,733) underlie the optional dielectric gate liner 755 and the dielectric gate spacer 756.

Each contiguous combination of a source-side doped extension region 731 and deep source region 732 constitutes a source region (731, 732). Each contiguous combination of a drain-side doped extension region 733 and deep drain region 734 constitutes a drain region (733, 733). A surface portion of the substrate semiconductor layer 10 located between the source-side doped extension region 731 and the drain-side doped extension region 733 constitutes a semiconductor channel 735. The source region (731, 732) and the drain region (733, 734) are collectively referred to as active regions {(731, 732), (733, 734)} The source region (731, 732) is also referred to as a first active region, and the drain region (733, 734) is also referred to as a second active region. Generally, the substrate semiconductor layer 10 has a doping of the first conductivity type, and embedding a first active region (731, 732) and a second active region (733, 734) having a doping of a second conductivity type that is an opposite of the first conductivity type. The first exemplary structure includes a field effect transistor.

Figure 4:
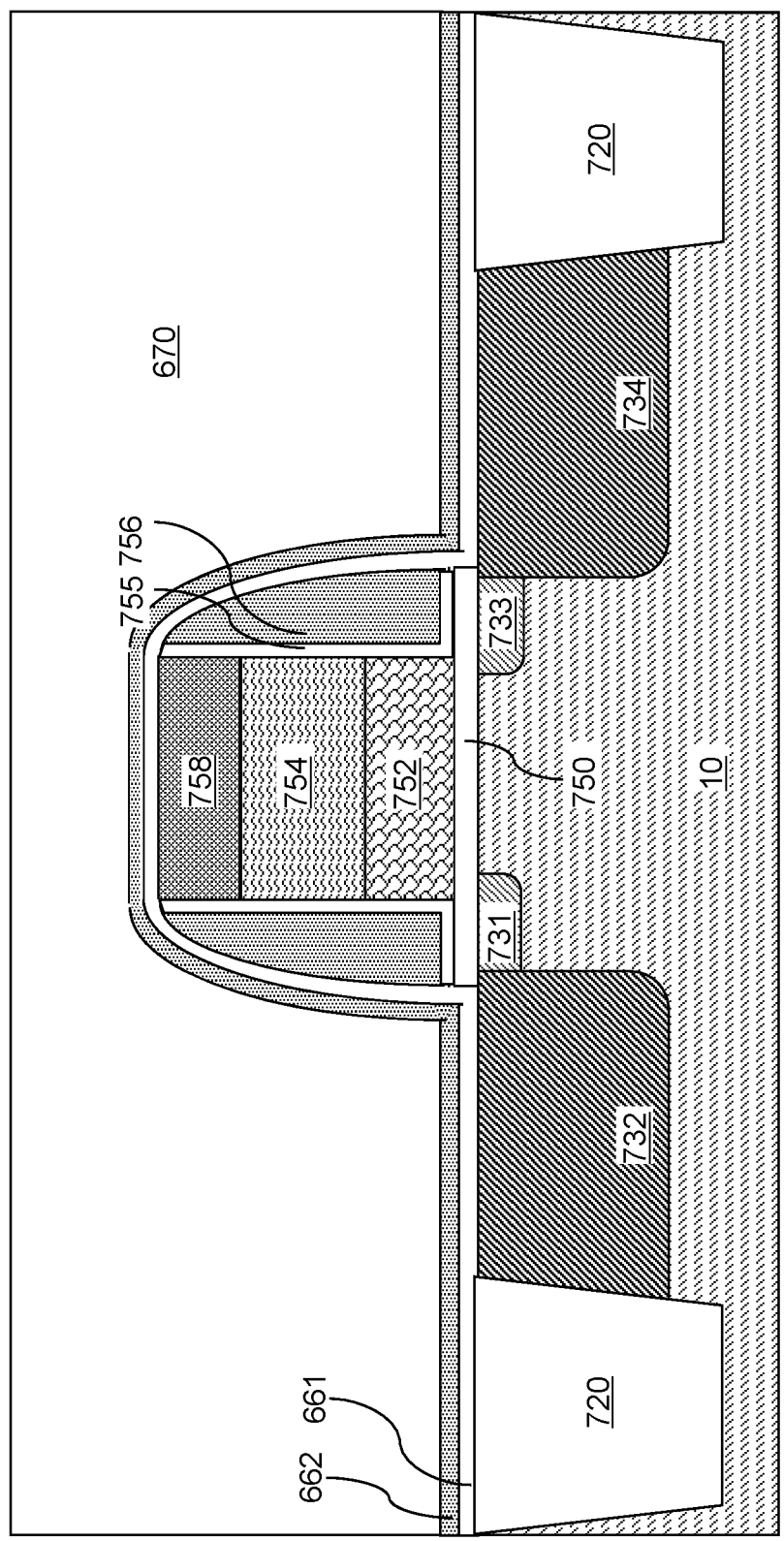
FIG. 4 is a vertical cross-sectional view of the first exemplary structure after formation of dielectric liner layers and a contact-level dielectric layer according to the first embodiment of the present disclosure.

Referring to FIG. 4, at least one dielectric liner layer (661, 662) may optionally be deposited over the gate stack structure (750, 752, 754, 758, 755, 756) and the substrate semiconductor layer 10. In one embodiment, the at least one dielectric liner layer (661, 662) can include a silicon oxide liner 661 and a silicon nitride liner 662. In one embodiment, the silicon oxide liner 661 can be deposited on, and over, the field effect transistor, and the silicon nitride liner 662 can be subsequently deposited on the silicon oxide liner 661. The silicon oxide liner 661 includes silicon oxide and can be formed by a conformal deposition process. For example, the silicon oxide liner 661 can be formed by decomposition of a silicon oxide precursor such as tetraethylorthosilicate (TEOS) in a low pressure chemical vapor deposition (LPCVD) process. The thickness of the silicon oxide liner 661 can be in a range from 1 nm to 10 nm, although lesser and greater thicknesses can also be employed. The silicon oxide liner 661 promotes adhesion of a silicon nitride liner to be subsequently formed.

The silicon nitride liner 662 can be deposited on the top surface of the silicon oxide liner 661. The silicon nitride liner 662 can be deposited by plasma enhanced chemical vapor deposition, which induces incorporation of hydrogen into the silicon nitride liner 662. The thickness of the horizontal portions of the silicon nitride liner 662 can be in a range from 10 nm to 100 nm, such as from 20 nm to 50 nm, although lesser and greater thicknesses can also be employed. While the present disclosure is described employing an embodiment in which the at least one dielectric liner layer (661, 662) comprises the silicon oxide liner 661 and the silicon nitride liner 662, embodiments are expressly contemplated herein in which no dielectric liners are present, only one dielectric liner layer is present, or three or more dielectric liner layers are present.

A planarization dielectric material can be subsequently deposited over the at least one dielectric liner layer (661, 662). The planarization dielectric material includes a planarizable dielectric material such as undoped silicate glass or doped silicate glass. Alternatively, the planarization dielectric material can include a self-planarizing dielectric material such as spin-on glass (SOG). A planar top surface of the dielectric material is provided by a planarization process such as chemical mechanical planarization, or by self-planarizing property of the planarization dielectric material. The layer of the planarization dielectric material is herein referred to as a contact-level dielectric layer 670. In case the planarization dielectric material includes deposited or spin-coated silicon oxide material, the contact-level dielectric layer 670 includes typical impurities contained in a deposited silicon oxide material. In one embodiment, the contact-level dielectric layer 670 can include hydrogen atoms at an atomic concentration greater than 3 part per million (p.p.m.) and carbon atoms at an atomic concentration greater than 1 part per million, which can be caused by incorporation of impurities during thermal decomposition of tetraethylorthosilicate (TEOS) or by incorporation of a residual solvent material during application of a spin-on-glass material. For example, the contact-level dielectric layer 670 can include hydrogen atoms at an atomic concentration in a range from 3 p.p.m. to 1,000 p.p.m., and can include carbon atoms at an atomic concentration in a range from 1 p.p.m. to 300 p.p.m. The top surface of the contact-level dielectric layer 670 may overlie the horizontal plane including the topmost surfaces of the gate electrode (752, 754) and of at least one dielectric liner layer (661, 662). The vertical distance between the top surface of the contact-level dielectric layer 670 and the horizontal plane including the topmost surface of the at least one dielectric liner layer (661, 662) can be in a range from 30 nm to 300 nm, such as from 60 nm to 150 nm, although lesser and greater distances can also be employed. The contact-level dielectric layer 670 is formed above, and around, the gate stack structure (750, 752, 754, 758, 755, 756) and above the substrate, which includes the substrate semiconductor layer 10, the first active region (731, 732), and the second active region (733, 734).

Figure 5:
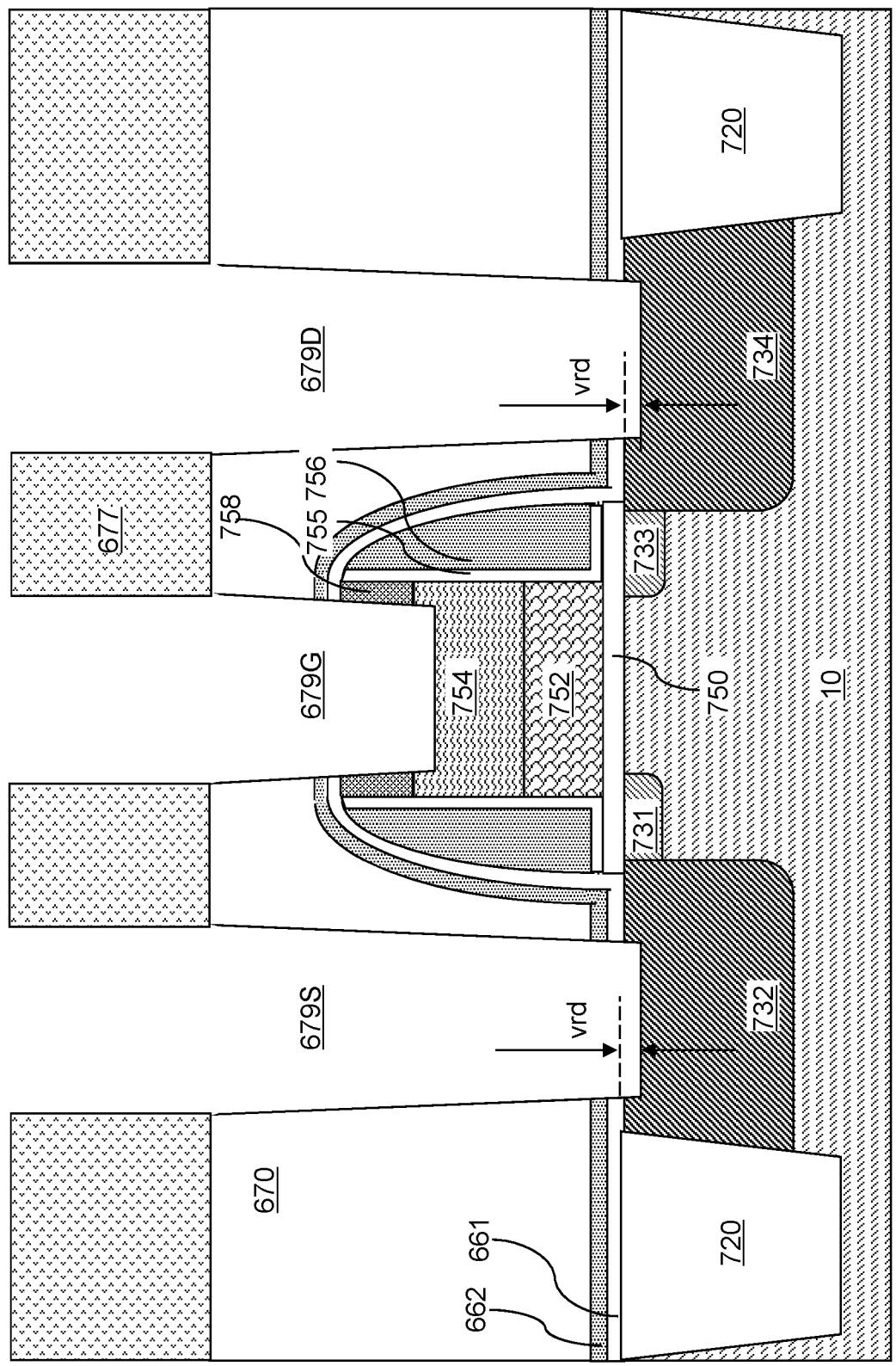
FIG. 5 is a vertical cross-sectional view of the first exemplary structure after formation of contact via cavities according to the first embodiment of the present disclosure.

Referring to FIG. 5, a photoresist layer 677 can be applied over the contact-level dielectric layer 670, and can be lithographically patterned to form contact openings in areas in which contact via structures are to be subsequently formed. For example, openings in the photoresist layer can be formed within areas of gate electrode (752, 754), the first active region (731, 732), and the second active region (733, 734) by lithographic exposure and development of the photoresist layer 677.

The pattern of the openings in the photoresist layer 677 can be transferred through the contact-level dielectric layer 670, the at least one dielectric liner layer (661, 662), and the gate cap dielectric 758 by an anisotropic etch process. The chemistry of the steps of the anisotropic etch process can be selected such that the various materials of the contact-level dielectric layer 670, the at least one dielectric liner layer (661, 662), and the gate cap dielectric 758 are etched through such that the contact via cavities (679S, 679D, 679G) extend into the first active region (731, 732), the second active region (733, 734), and the gate electrode (752, 754). For example, a first step of the anisotropic etch process can etch through unmasked regions of the upper portion of the contact-level dielectric layer 670 overlying the horizontal plane including the topmost surface of the at least one dielectric liner layer (661, 662). A second step of the anisotropic etch process can etch through unmasked regions of the portions of the at least one dielectric liner layer (661, 662) selective to the gate cap dielectric 758. A third step of the anisotropic etch process can vertically extend contact cavities overlying the first active region (731, 732) and the second active region (733, 734) employing the at least one dielectric liner layer (661, 662) as an etch stop layer.

A fourth step and a fifth step can include a step for etching through the portions of the at least one dielectric liner layer (661, 662) overlying the first active region (731, 732) or the second active region (733, 734), and a step for etching through the gate cap dielectric 758. In one embodiment, the fourth step include the step for etching through the portions of the at least one dielectric liner layer (661, 662) overlying the first active region (731, 732) or the second active region (733, 734), and the fifth step can include the step for etching through the gate cap dielectric 758. Alternatively, the fourth step include the step for etching through the gate cap dielectric 758, and the fifth step can include the step for etching through the portions of the at least one dielectric liner layer (661, 662) overlying the first active region (731, 732) or the second active region (733, 734). The first active region (731, 732) and the second active region (733, 734) can be employed as etch stop structures during the step for through the portions of the at least one dielectric liner layer (661, 662) overlying the first active region (731, 732) or the second active region (733, 734). The metallic gate electrode portion 754 can be employed as an etch stop structure during the step for etching through the gate cap dielectric 758. In one embodiment, the fourth step and the fifth step of the anisotropic etch process may be merged into a single anisotropic etch step in which the unmasked portions of the gate cap dielectric 758 and the unmasked portions of the at least one dielectric liner layer (661, 662) are simultaneously etched.

According an embodiment of the present disclosure, the anisotropic etch process can include a terminal etch step that vertically recesses unmasked portions of the first active region (731, 732) and the second active region (733, 734). Unmasked portions of the first active region (731, 732) and the second active region (733, 734) are vertically recessed with respect to the top surface of the substrate semiconductor layer 10 by a vertical recess distance vrd, which can be in a range from 3 nm to 60 nm, such as from 6 nm to 30 nm and/or from 10 nm to 20 nm. The terminal etch process can have an etch chemistry that etches the semiconductor material of the first active region (731, 732) and the second active region (733, 734) selective to, or without selectivity to, the material of the metallic gate electrode portion 754.

Contact via cavities (679S, 679D, 679G) are formed through the contact-level dielectric layer 670, the at least one dielectric liner layer (661, 662), and the gate cap dielectric 758. The contact via cavities (679S, 679D, 679G) can include a first contact via cavity 679S that vertically extends from the top surface of the contact-level dielectric layer 670 to a recessed surface of the deep source region 732, a second contact via cavity 679D that vertically extends from the top surface of the contact-level dielectric layer 670 to a recessed surface of the deep drain region 734, and a third contact via cavity 679G that vertically extends from the top surface of the contact-level dielectric layer 670 to a surface of the gate electrode (752, 754), which may be a surface of the metallic gate electrode portion 754. The first contact via cavity 679S is also referred to as a source-contact via cavity. The second contact via cavity 679D is also referred to as a drain-contact via cavity. The third contact via cavity 679G is also referred to as a gate-contact via cavity.

The first contact via cavity 679S vertically extends through the contact-level dielectric layer 670 into the first active region (731, 732). The bottom surface of the first contact via cavity 679S can be vertically recessed below the horizontal plane including the top surface of the first active region (731, 732) by the vertical recess distance vrd. The sidewall of the first contact via cavity 679S can be cylindrical with, or without, a taper angle with respect to the vertical direction. If the sidewall of the first contact via cavity 679S is tapered, the taper angle of the sidewall of the first contact via cavity 679S can be in a range from 0.1 degree to 5 degrees. The sidewalls of the first contact via cavity 679S can vertically extend straight from the top surface of the contact-level dielectric layer 670 to the recessed surface of the first active region (731, 732).

Likewise, the second contact via cavity 679D vertically extends through the contact-level dielectric layer 670 into the second active region (733, 734). The bottom surface of the second contact via cavity 679D can be vertically recessed below the horizontal plane including the top surface of the second active region (733, 734) by the vertical recess distance vrd. The sidewall of the second contact via cavity 679D can be cylindrical with, or without, a taper angle with respect to the vertical direction. If the sidewall of the second contact via cavity 679D is tapered, the taper angle of the sidewall of the second contact via cavity 679D can be in a range from 0.1 degree to 5 degrees. The sidewalls of the second contact via cavity 679D can vertically extend straight from the top surface of the contact-level dielectric layer 670 to the recessed surface of the second active region (733, 734). The photoresist layer can be removed from above the contact-level dielectric layer 670, for example, by ashing.

Figure 6:
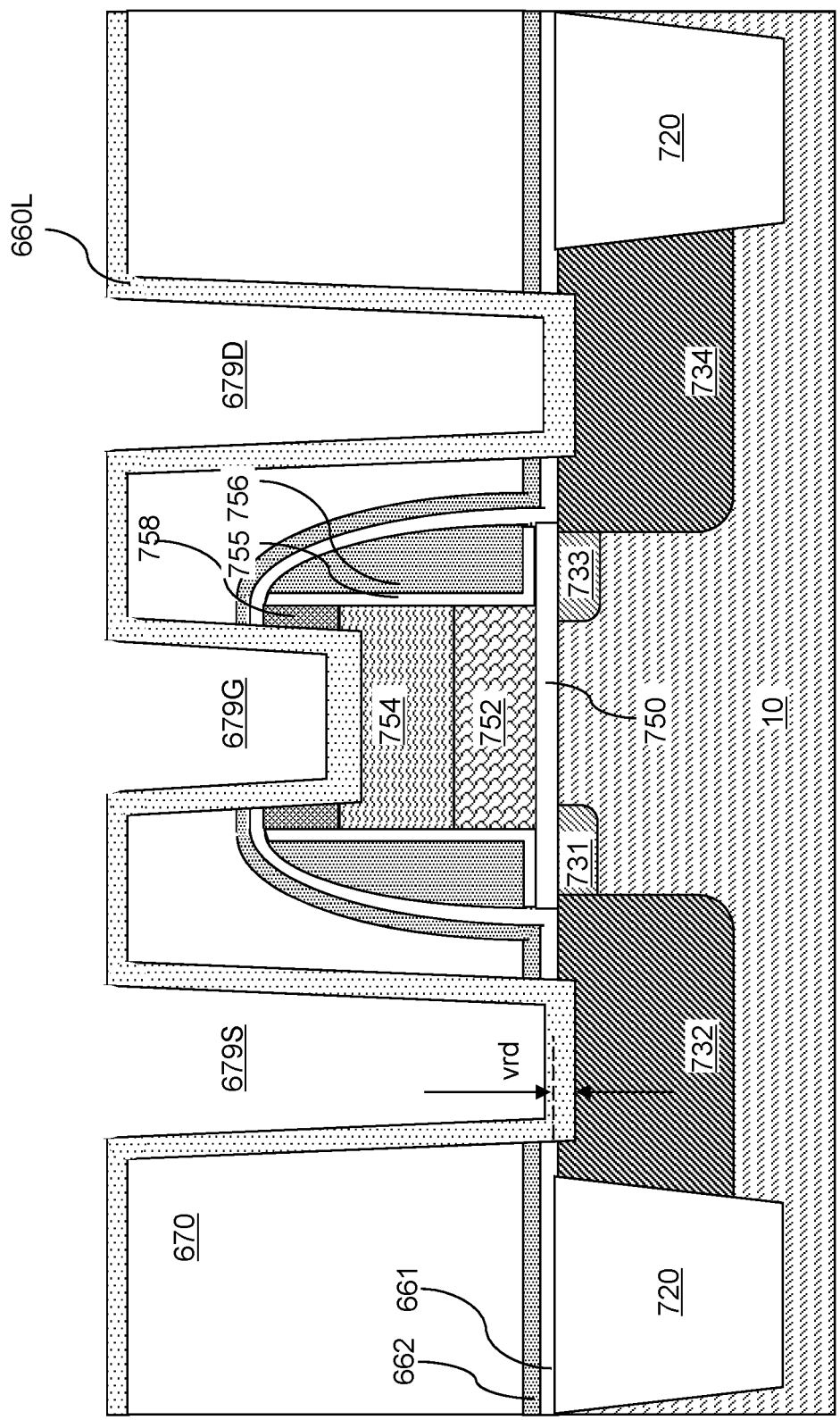
FIG. 6 is a vertical cross-sectional view of the exemplary structure after formation of a liner spacer material layer according to the first embodiment of the present disclosure.

Referring to FIG. 6, a liner spacer material layer 660L can be deposited the physically exposed surfaces of the contact-level dielectric layer 670 and the respective cavities (679S, 679D, 679G), the first active region (731, 732), the second active region (733, 734), and the gate electrode (752, 754). The liner spacer material layer 660L is formed on a recessed top surface of the first active region (731, 732), on a recessed top surface of the second active region (733, 734), on a top surface of the gate electrode (752, 754), on the sidewall of the first via cavity 679S, on the sidewall of the second via cavity 679D, on the sidewall of the third via cavity 679G, and over the contact-level dielectric layer 670.

The liner spacer material layer 660L includes, and/or consists essentially of, at least one dielectric material or a conductive metallic nitride material. In one embodiment, the liner spacer material layer 660L can include, and/or can consist essentially of, at least one dielectric material. For example, the liner spacer material layer 660L can include silicon nitride, undoped silicate glass, silicon oxynitride, silicon oxide carbide, and/or at least dielectric metal oxide (such as aluminum oxide, hafnium oxide, zirconium oxide, tantalum oxide, titanium oxide, and/or lanthanum oxide). The liner spacer material layer 660L may include a single dielectric material layer or a plurality of dielectric material layers. In case a plurality of dielectric material layers is employed for the liner spacer material layer 660L, one of the dielectric material layers may include a diffusion barrier layer such as a silicon nitride layer. For example, the liner spacer material layer 660L may include a layer stack of a silicon nitride layer and a dielectric metal oxide layer. In one embodiment, at least one dielectric material layer within the liner spacer material layer 660L may have a different material composition than the contact-level dielectric layer 670. Each layer within the liner spacer material layer 660L can be deposited by a conformal deposition process such as a chemical vapor deposition process or an atomic layer deposition process. The total thickness of the liner spacer material layer 660L can be in a range from 3 nm to 60 nm, such as from 6 nm to 30 nm, although lesser and greater thicknesses can also be employed.

In another embodiment, the liner spacer material layer 660L can include, and/or can consist essentially of, at least one conductive metallic nitride material such as TiN, TiSiN, TaN, and/or WN. The liner spacer material layer 660L may include a single metallic nitride material layer or a layer stack of a plurality of metallic nitride material layers. The liner spacer material layer 660L can be deposited by a non-conformal deposition process such as a physical vapor deposition process, or by a conformal deposition process such as a chemical vapor deposition process or an atomic layer deposition process. The lateral thickness of the liner spacer material layer 660L, as measured over a sidewall of the contact via cavities (679S, 679D, 679G) can be in a range from 3 nm to 60 nm, such as from 6 nm to 30 nm, although lesser and greater thicknesses can also be employed.

Figure 7:
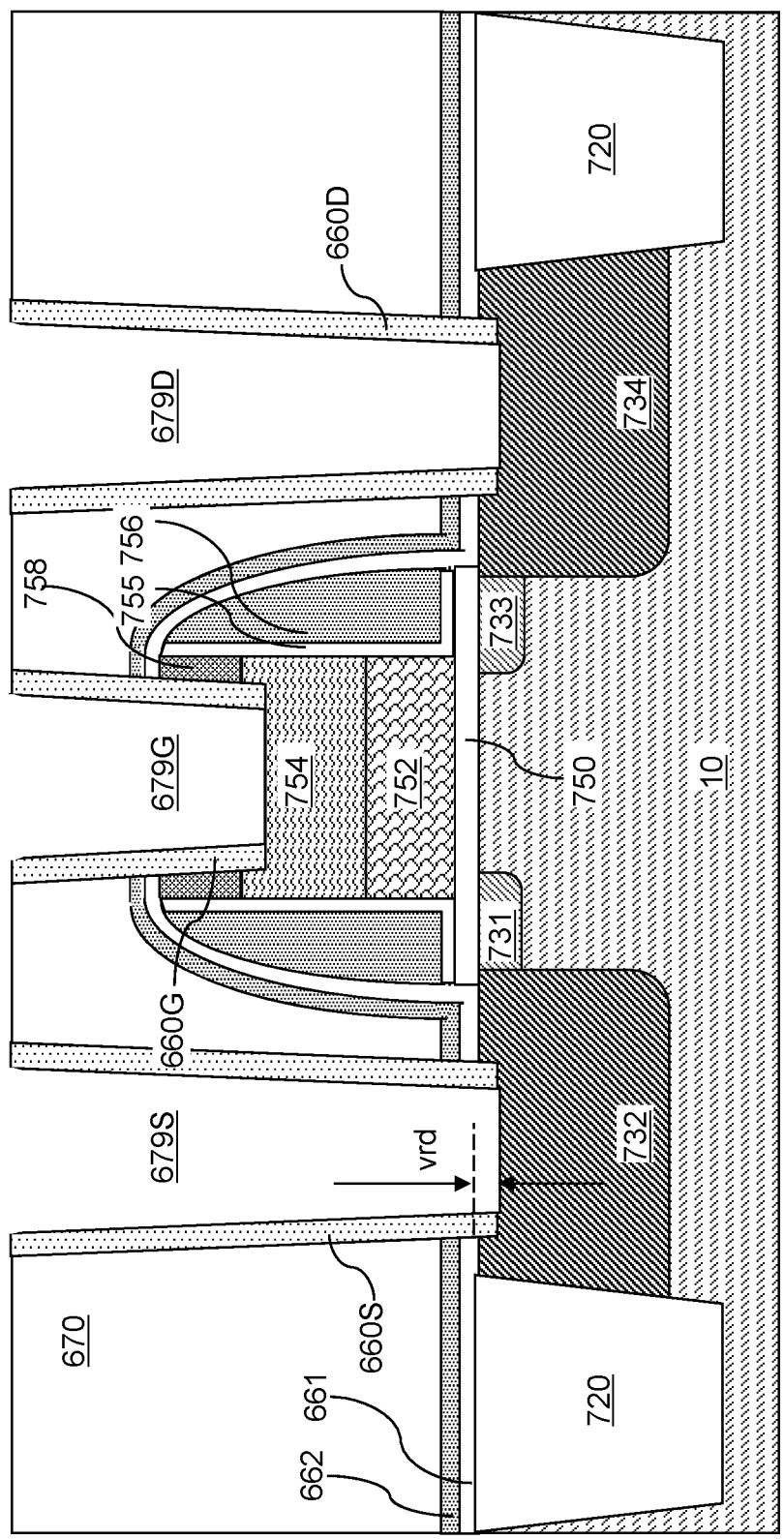
FIG. 7 is a vertical cross-sectional view of the first exemplary structure after formation of tubular liner spacers according to the first embodiment of the present disclosure.

Referring to FIG. 7, an anisotropic etch process that etches the material(s) of the liner spacer material layer 660L can be performed to etch horizontal portions of the liner spacer material layer 660L. The etch chemistry of the anisotropic etch process can be selective to the semiconductor material of the first active region (731, 732) and the second active region (733, 734). Horizontal portions of the liner spacer material layer 660L are anisotropically etched by the anisotropic etch process. Each remaining cylindrical vertical portion of the liner spacer material layer 660L located at a periphery of a respective one of the contact via cavities (679S, 679D, 679G) constitutes a tubular liner spacer (660S, 660D, 660G).

The tubular liner spacers (660S, 660D, 660G) can include a first tubular liner spacer 660S formed on the top surface of the first active region (731, 732) at a periphery of the first contact via cavity 679S. The first tubular liner spacer 660S is also referred to as a source-side tubular liner spacer. The tubular liner spacers (660S, 660D, 660G) can include a second tubular liner spacer 660D formed on the top surface of the second active region (733, 734) at a periphery of the second contact via cavity 679D. The second tubular liner spacer 660D is also referred to as a drain-side tubular liner spacer. The tubular liner spacers (660S, 660D, 660G) can include a third tubular liner spacer 660G formed on the top surface of the gate electrode (752, 754) at a periphery of the third contact via cavity 679G. The third tubular liner spacer 660G is also referred to as a gate-side tubular liner spacer.

Each of the tubular liner spacers (660S, 660D, 660G) can include, and/or can consist essentially of, at least one dielectric material or a conductive metallic nitride material. Each of the tubular liner spacers (660S, 660D, 660G) can include a respective annular bottom surface. For example, the first tubular liner spacer 660S can include a first annular bottom surface that contacts a recessed top surface of the first active region (731, 732), the second tubular liner spacer 660D can include a second annular bottom surface that contacts a recessed top surface of the second active region (733, 734), and the third tubular liner spacer 660G can include a third annular bottom surface that contacts a top surface of the gate electrode (752, 754). The inner periphery of each tubular liner spacer (660S, 660D, 660G) can be spaced from the outer periphery of the tubular liner spacer (660S, 660D, 660G), which is the lateral thickness of the tubular liner spacer (660S, 660D, 660G).

A cylindrical bottom segment of an outer sidewall of the first tubular liner spacer 660S can contact a cylindrical surface of the first active region (731, 732), and a cylindrical bottom segment of the outer sidewall of the second tubular liner spacer 660D can contact a cylindrical surface of the second active region (733, 734). The height of the cylindrical bottom segment of the outer sidewall of the first tubular liner spacer 660S and the height of the cylindrical bottom segment of the outer sidewall of the second tubular liner spacer 660D can be the same as the vertical recess distance vrd.

Thus, the first annular bottom surface of the first tubular liner spacer 660S can be located below the horizontal plane including the interface between the substrate semiconductor layer 10 and the gate dielectric 750, and the first annular bottom surface of the first tubular liner spacer 660S can be vertically offset from the horizontal plane including the interface between the substrate semiconductor layer 10 and the gate dielectric 750 by the vertical offset distance vrd, which may be in a range from 3 nm to 60 nm. Likewise, the second annular bottom surface of the second tubular liner spacer 660D can be located below the horizontal plane including the interface between the substrate semiconductor layer 10 and the gate dielectric 750, and the second annular bottom surface of the second tubular liner spacer 660D can be vertically offset from the horizontal plane including the interface between the substrate semiconductor layer 10 and the gate dielectric 750 by the vertical offset distance vrd. The third tubular liner spacer 660G, i.e., the gate tubular liner spacer, can include a third annular bottom surface that contacts the top surface of the gate electrode (752, 754).

In one embodiment, the tubular liner spacers (660S, 660D, 660G) can include, and/or can consist essentially of, at least one dielectric material. In another embodiment, the tubular liner spacers (660S, 660D, 660G) can include, and/or can consist essentially of, a conductive metallic nitride material.

Figure 8:
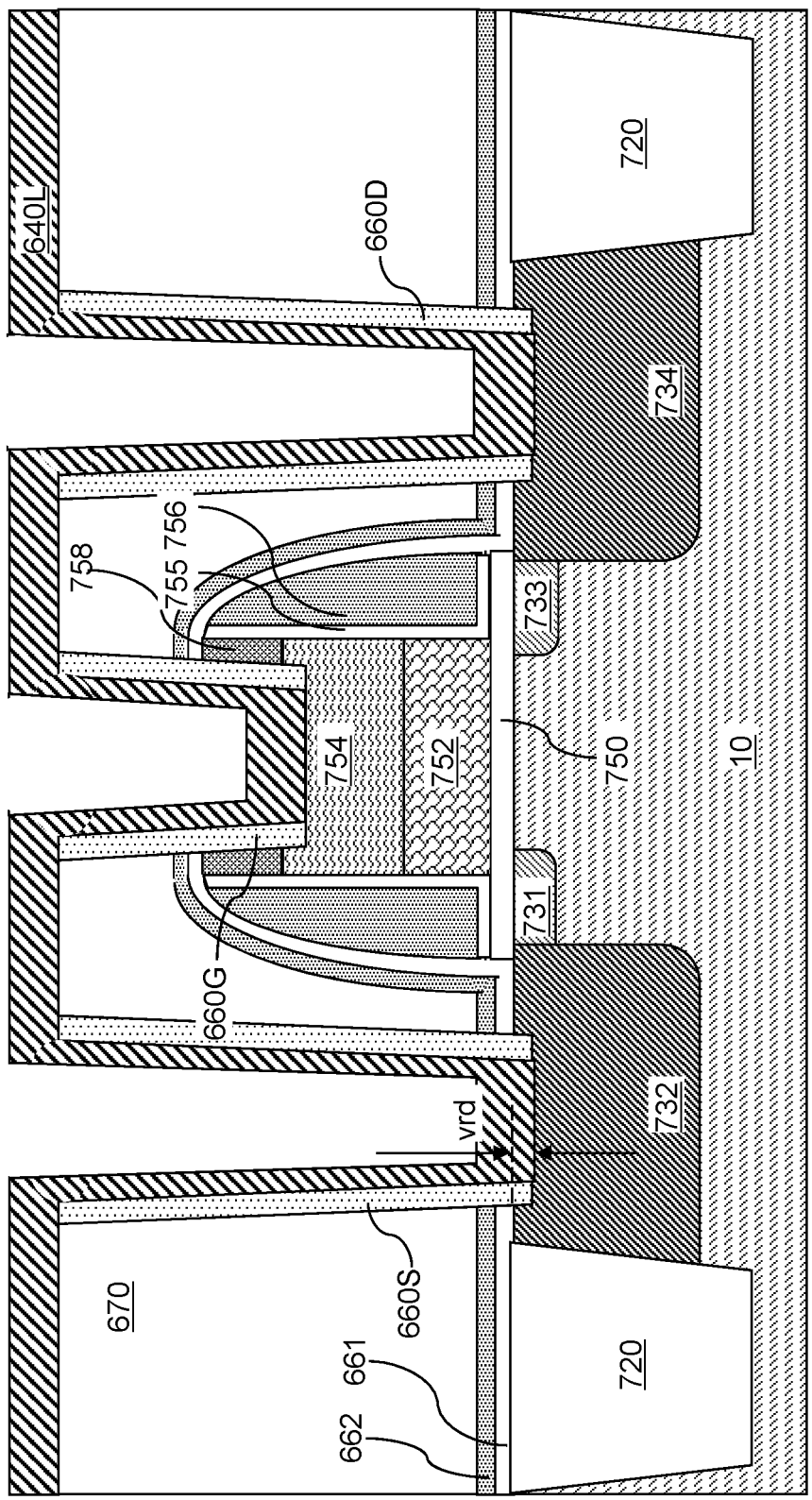
FIG. 8 is a vertical cross-sectional view of the first exemplary structure after formation of a metal layer according to the first embodiment of the present disclosure.

Referring to FIG. 8, at least one metal that can form a metal-semiconductor alloy material with the semiconductor material of the substrate semiconductor layer 10 can be deposited in the various contact via cavities (679S, 679D, 679G) to form a metal layer 640L. If the substrate semiconductor layer 10 includes silicon, the metal layer 640L can include, and/or can consist essentially of, at least one metal that can form a metal silicide material. For example, the metal layer 640L can include at least one metal selected from W, Mo, Ti, Ni, Pt, and/or alloys thereof. The metal layer 640L can be formed by conformal or non-conformal deposition of the at least one metal. For example, the first exemplary structure can be placed in a physical vapor deposition chamber, and the at least one metal can be sputtered from a sputtering target including the at least one metal onto the first exemplary structure in a physical vapor deposition process. The thickness of the metal layer 640L at horizontal portions that contact the first active region (731, 732) or the second active region (733, 734) can be in a range from 5 nm to 100 nm, such as from 10 nm to 50 nm, although lesser and greater thicknesses can also be employed.

Figure 9A:
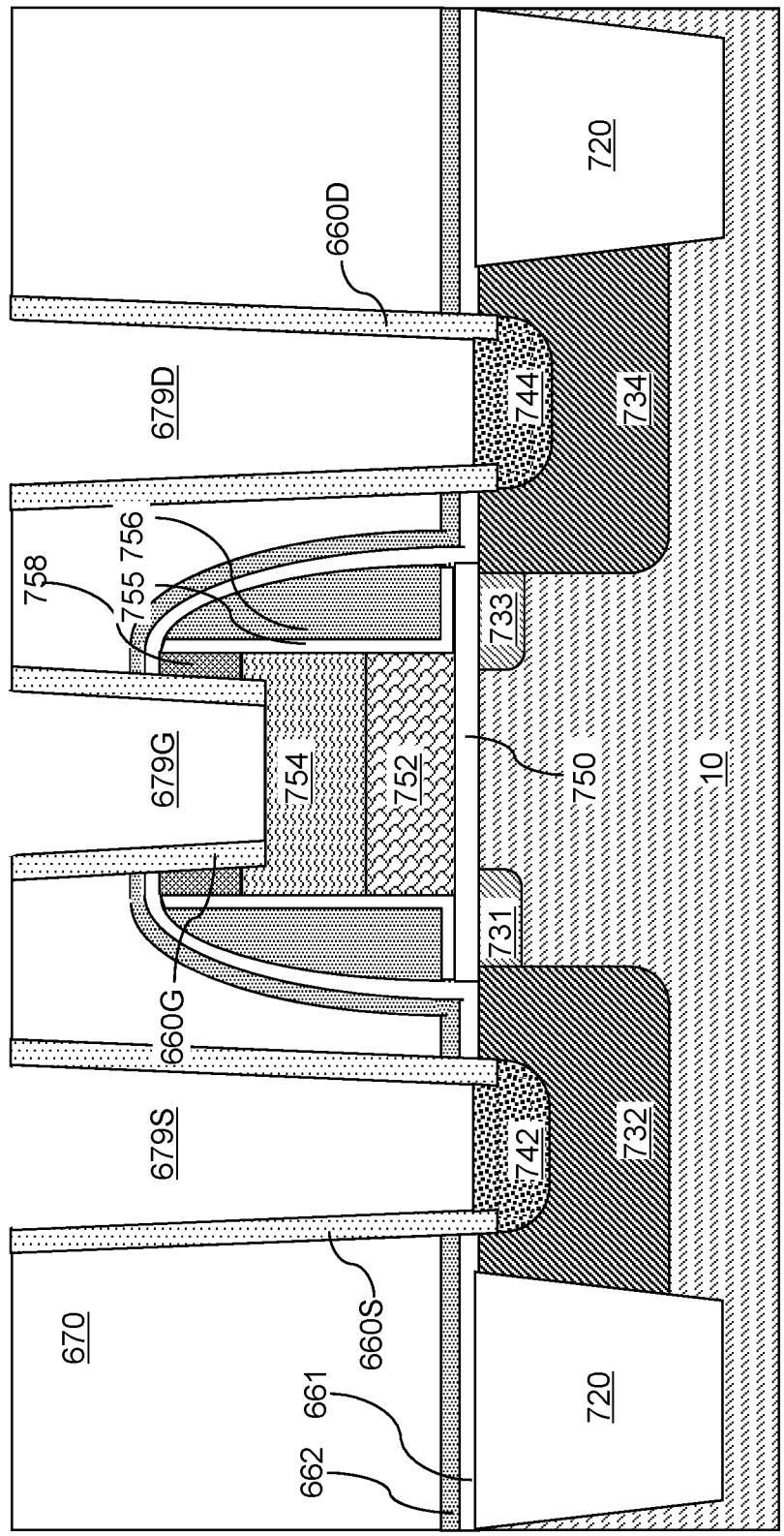
FIGS. 9A and 9B are vertical cross-sectional views of the first exemplary structure after formation of metal-semiconductor alloy portions according to alternative aspects of the first embodiment of the present disclosure.

Referring to FIG. 9A, in one aspect of the first embodiment, metal-semiconductor alloy portions are formed by reacting the metal layer 640L with the semiconductor material in the active regions followed by removing the remaining unreacted portions of the metal layer 640L. In this aspect, a thermal anneal process can be performed at an elevated temperature to induce reaction between the metal layer 640L and the semiconductor material in the active regions {(731, 732), (733, 734)}. The elevated temperature may be in a range from 500 degrees Celsius to 1,000 degrees Celsius, such as from 600 degrees Celsius to 900 degrees Celsius, although lower and higher temperatures can also be employed. The duration of the thermal anneal process at the elevated temperature may be in a range from 30 seconds to 600 seconds, although shorter or longer duration may also be employed. The at least one metal is reacted with a surface portion of the first active region (731, 732) and a surface portion of the second active region (733, 734). A reacted portion of the metal layer 640L and the first active region (731, 732) forms first metal-semiconductor alloy portion 742. A reacted portion of the metal layer 640L and the second active region (733, 734) forms a second metal-semiconductor alloy portion 744. If the substrate semiconductor layer 10 includes silicon, the first metal-semiconductor alloy portion 742 and the second metal-semiconductor alloy portion 744 can include a metal silicide material, such a tungsten, molybdenum, titanium, nickel or platinum silicide.

Unreacted portions of the metal layer 640L can be subsequently removed selective to the material of the metal-semiconductor alloy portions (742, 744). For example, the unreacted portions of the at least one metal in the metal layer 640L can be etched selective to the metal-semiconductor alloy material of the first metal-semiconductor alloy portion 742 and the second metal-semiconductor alloy portion 744. Removal of the unreacted portions of the metal layer 640L may be selective to the material of the metallic gate electrode 754. For example, a wet etch employing a mixture of sulfuric acid and hydrogen peroxide can be performed to remove the at least one metal of the metal layer 640L selective to the metal-semiconductor alloy material of the metal-semiconductor alloy portions (742, 744).

According to an aspect of the present disclosure, the lateral extent of each metal-semiconductor alloy portion (742, 744) can be limited due to the vertical offset of the interface between the metal layer 640L and the semiconductor material of the active regions {(741, 742), (743, 744)} relative to the top surface of the substrate semiconductor layer 10. In one embodiment, the sum of the lateral width of each tubular liner spacer (660S, 660D, 660G) and the vertical recess distance vrd can be less than the distance by which the metallization (such as silicidation) front of the metal-semiconductor alloy formation process moves. In this case, the metal-semiconductor alloy portions (742, 744) may not extend laterally past the respective tubular liner spacers (660S, 660D), and the periphery at which each metal-semiconductor alloy portion (742, 744) contacts an annular bottom surface of a respective one of the first tubular liner spacer 660S or the second tubular liner spacer 660D is vertically offset from the top surface of the substrate semiconductor layer 10. Thus, lateral extent of each metal-semiconductor alloy portion (742, 744) can be reduced relative to a comparative exemplary structure in which the vertical recess depth is zero and the tubular liner spacers (660S, 660D, 660G) are not present, and the first exemplary structure can provide reduced leakage current and a reduced likelihood that an electrical short occurs between the metal-semiconductor alloy portions (742, 744) and the gate electrode (752, 754) relative to the comparative exemplary structure.

The first metal-semiconductor alloy portion 742 is formed on the first active region (731, 732) at a bottom region of the first contact via cavity 679S. The second metal-semiconductor alloy portion 744 is formed on the second active region (733, 734) at the bottom of the second contact via cavity 679D. The first metal-semiconductor alloy portion 742 can have a bottom surface located below the horizontal plane including the annular bottom surface of the first tubular liner spacer 660S, and can have a top surface that is located above the horizontal plane including the annular bottom surface of the first tubular liner spacer 660S. The second metal-semiconductor alloy portion 744 can have a bottom surface located below the horizontal plane including the annular bottom surface of the second tubular liner spacer 660D, and can have a top surface that is located above the horizontal plane including the annular bottom surface of the second tubular liner spacer 660D.

The first metal-semiconductor alloy portion 742 is embedded in the first active region (731, 732), and the second metal-semiconductor alloy portion 744 is embedded in the second active region (733, 734). The first annular bottom surface of the first tubular liner spacer 660S contacts a recessed annular top surface of the first metal-semiconductor alloy portions 742, and the second annular bottom surface of the second tubular liner spacer 660D contacts a recessed annular top surface of the second metal-semiconductor alloy portions 744.

In one embodiment, a cylindrical bottom segment of an inner sidewall of the first tubular liner spacer 660S contacts a cylindrical sidewall of the first metal-semiconductor alloy portion 742, and a cylindrical bottom segment of an inner sidewall of the second tubular liner spacer 660D contacts a cylindrical sidewall of the second metal-semiconductor alloy portion 744. In one embodiment, the first metal-semiconductor alloy portion 742 is not in direct contact with the topmost surface of the first active region (731, 732), which can be located within the same horizontal plane as the interface between the substrate semiconductor layer 10 and the gate dielectric 750, and can be located within the same horizontal plane as the interface between the first active region (731, 732) and the gate dielectric 750. In this case, the second metal-semiconductor alloy portion 744 is not in direct contact with the topmost surface of the second active region (733, 734), which can be located within the same horizontal plane as the interface between the substrate semiconductor layer 10 and the gate dielectric 750, and can be located within the same horizontal plane as the interface between the second active region (733, 734) and the gate dielectric 750.

Figure 9B:
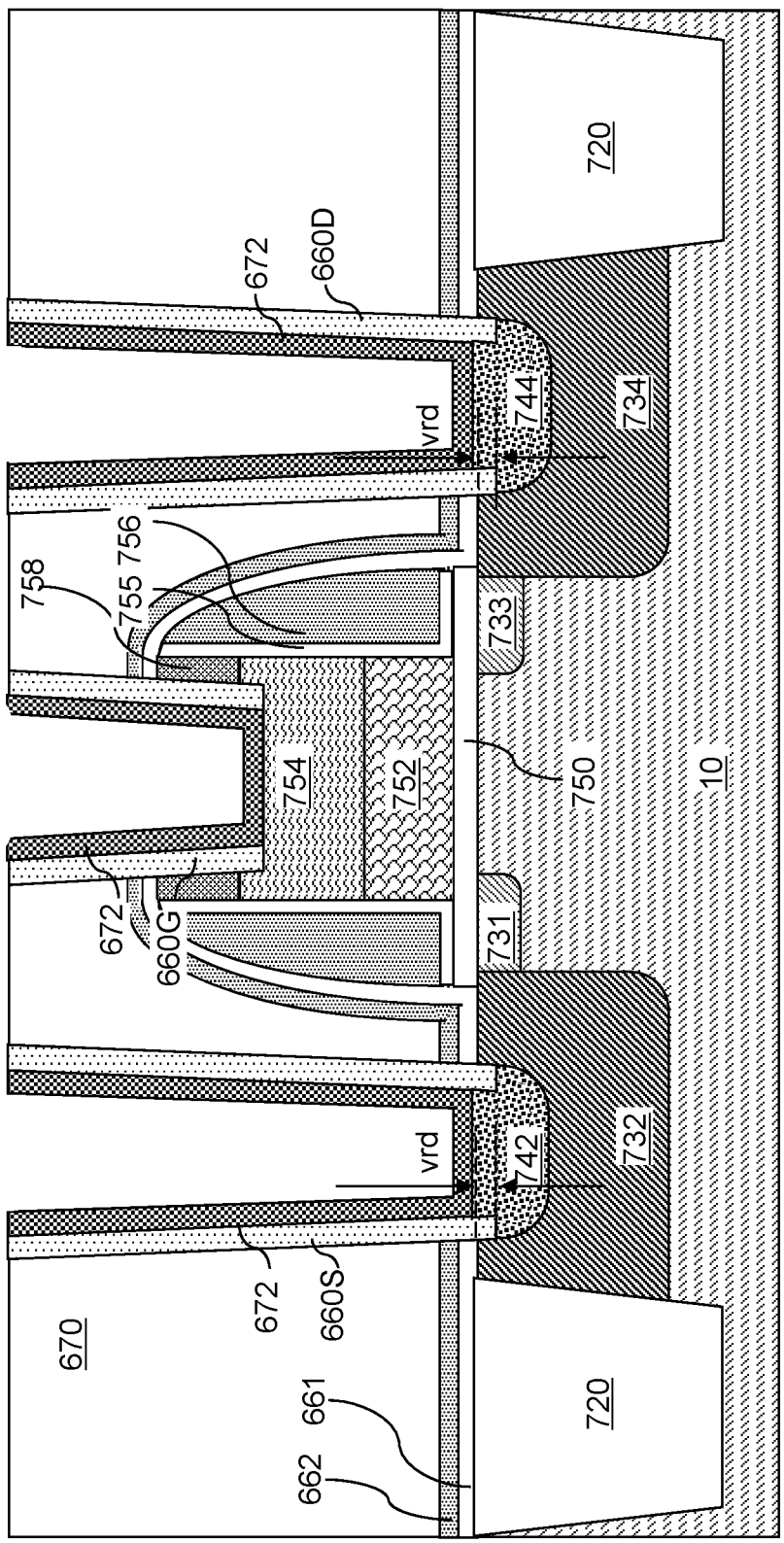

Referring to FIG. 9B, in a second aspect of the first embodiment, metal-semiconductor alloy portions are formed by reacting the metal layer 640L with the semiconductor material in the active regions at the same time as forming a metallic nitride liner layer 672. In this aspect, the metal layer 640L comprises a barrier metal which can form a metal nitride diffusion barrier, such as titanium. In this second aspect, the thermal anneal process is performed at an elevated temperature and in a nitrogen containing ambient, such as ammonia or nitrogen gas to induce reaction between the bottom of the metal layer 640L and the semiconductor material in the active regions {(731, 732), (733, 734)}, while at the same time converting the remaining portions of the metal layer 640 into a metal nitride liner layer, such as a titanium nitride liner layer 672. The upper portions of the metallic nitride liner layer 672 overlying the contact-level dielectric layer 670 are then removed by CMP either before or after forming the metallic fill material inside the metallic nitride liner layer 672, as will be described below with respect to FIG. 10.

Figure 10:
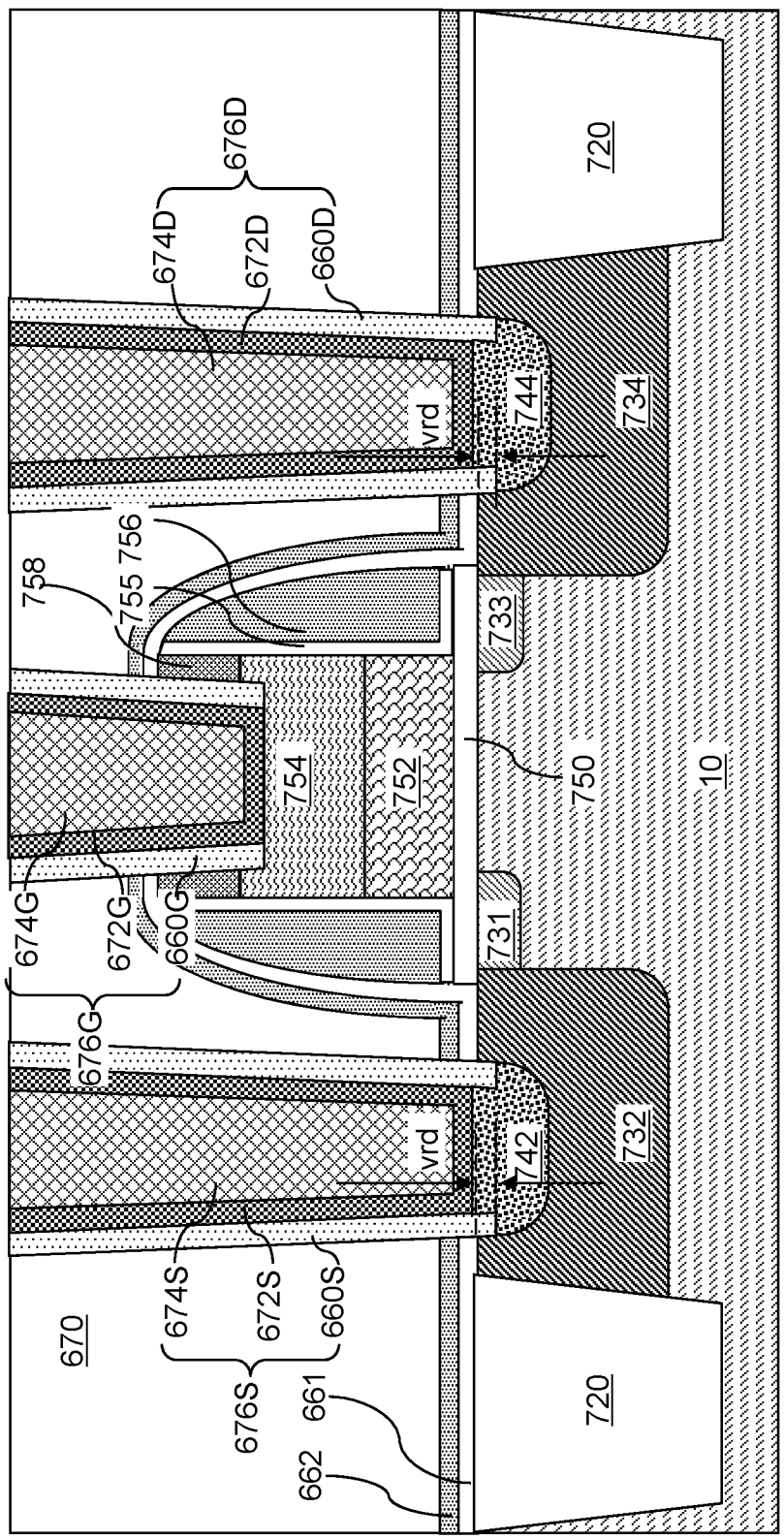
FIG. 10 is a vertical cross-sectional view of the first exemplary structure after formation of metallic nitride liners and metallic fill material portions according to the first embodiment of the present disclosure.

Referring to FIG. 10, if the process of the first aspect of the first embodiment illustrated in FIG. 9A is followed, then a metallic nitride liner layer can be deposited in the various via cavities (679S, 679D, 679G) by a conformal or non-conformal deposition process. The metallic nitride liner layer can include at least one metallic nitride material such as TiN, TaN, and/or WN. The horizontal portion of the metallic nitride liner layer contacting top surfaces of the metal-semiconductor alloy portions (742, 742) can be in a range from 3 nm to 30 nm, such as from 6 nm to 15 nm, although lesser and greater thicknesses can also be employed. In case the tubular liner spacers (660S, 660D, 660G) include a metallic nitride material, the metallic nitride material of the metallic nitride liner layer may have a different material composition than the tubular liner spacers (660S, 660D, 660G). Alternatively, if the process of the second aspect of the first embodiment illustrated in FIG. 9B is followed, then the metallic nitride liner layer is already present in the various via cavities.

A metallic fill material such as W, Cu, Ru, Co, and/or Mo can be deposited in remaining volumes of the various via cavities. The metallic fill material may be deposited by chemical vapor deposition, physical vapor deposition, and/or electroplating. The metallic fill material can be deposited such that remaining volumes of the various via cavities are filled with the metallic fill material. Excess portions of the metallic fill material and the metallic nitride material of the metallic nitride liner layer can be removed from above the horizontal plane including the top surface of the contact-level dielectric layer 670 by a planarization process such as chemical mechanical planarization (CMP).

A remaining portion of the metallic nitride liner layer 672 in the first contact via cavity 679S constitutes a first metallic nitride liner 672S. The first metallic nitride liner 672S is formed on the top surface of the first metal-semiconductor alloy portion 742 and on an inner sidewall of the first tubular liner spacer 660S. The first metallic nitride liner 672S contacts an inner sidewall of the first tubular liner spacer 660S, and has a bottom surface that is located above the horizontal plane including the first annular bottom surface of the first tubular liner spacer 660S. The entirety of the bottom surface of the first metallic nitride liner 672S can contact a top surface of the first metal-semiconductor alloy portions 742.

A remaining portion of the metallic fill material in the first contact via cavity constitutes a first metallic fill material portion 674S. The first metallic fill material portion 674S is formed within the first metallic nitride liner 672S, and is embedded in the first metallic nitride liner 672S. The first contact via cavity 679S as formed at the processing steps of FIG. 5 is filled with a first composite contact via structure 676S, which includes the first tubular liner spacer 660S, the first metallic nitride liner 672S, and the first metallic fill material portion 674S. The first composite contact via structure 676S vertically extends through the contact-level dielectric layer 670. In one embodiment, each the first tubular liner spacer 660S, the first metallic nitride liner 672S, and the first metallic fill material portion 674S can have a respective top surface located within the horizontal plane including the top surface of the contact-level dielectric layer 670.

A remaining portion of the metallic nitride liner layer 672 in the second contact via cavity constitutes a second metallic nitride liner 672D. The second metallic nitride liner 672D is formed on the top surface of the second metal-semiconductor alloy portion 744 and on an inner sidewall of the second tubular liner spacer 660D. The second metallic nitride liner 672D contacts an inner sidewall of the second tubular liner spacer 660D, and has a bottom surface that is located above the horizontal plane including the second annular bottom surface of the second tubular liner spacer 660D. The entirety of the bottom surface of the second metallic nitride liner 672D can contact a top surface of the second metal-semiconductor alloy portions 744.

A remaining portion of the metallic fill material in the second contact via cavity 679D constitutes a second metallic fill material portion 674D. The second metallic fill material portion 674D is formed within the second metallic nitride liner 672D, and is embedded in the second metallic nitride liner 672D. The second contact via cavity 679D as formed at the processing steps of FIG. 5 is filled with a second composite contact via structure 676D, which includes the second tubular liner spacer 660D, the second metallic nitride liner 672D, and the second metallic fill material portion 674D. The second composite contact via structure 676D vertically extends through the contact-level dielectric layer 670. In one embodiment, each the second tubular liner spacer 660D, the second metallic nitride liner 672D, and the second metallic fill material portion 674D can have a respective top surface located within the horizontal plane including the top surface of the contact-level dielectric layer 670.

A remaining portion of the metallic nitride liner layer in the third contact via cavity constitutes a third metallic nitride liner 672G. The third metallic nitride liner 672G is formed on the top surface of the gate electrode (752, 754) and on an inner sidewall of the third tubular liner spacer 660G. The third metallic nitride liner 672G contacts an inner sidewall of the third tubular liner spacer 660G, and may have a bottom surface that is located within the horizontal plane including the third annular bottom surface of the third tubular liner spacer 660G. The entirety of the bottom surface of the third metallic nitride liner 672G can contact a top surface of the gate electrode (752, 754).

A remaining portion of the metallic fill material in the third contact via cavity 679G constitutes a third metallic fill material portion 674D. The third metallic fill material portion 674G is formed within the third metallic nitride liner 672G, and is embedded in the third metallic nitride liner 672G. The third contact via cavity 679G as formed at the processing steps of FIG. 5 is filled with a third composite contact via structure 676G, which includes the third tubular liner spacer 660G, the third metallic nitride liner 672G, and the third metallic fill material portion 674G. The third composite contact via structure 676G vertically extends through the contact-level dielectric layer 670. In one embodiment, each the third tubular liner spacer 660G, the third metallic nitride liner 672G, and the third metallic fill material portion 674G can have a respective top surface located within the horizontal plane including the top surface of the contact-level dielectric layer 670.

Figure 11:
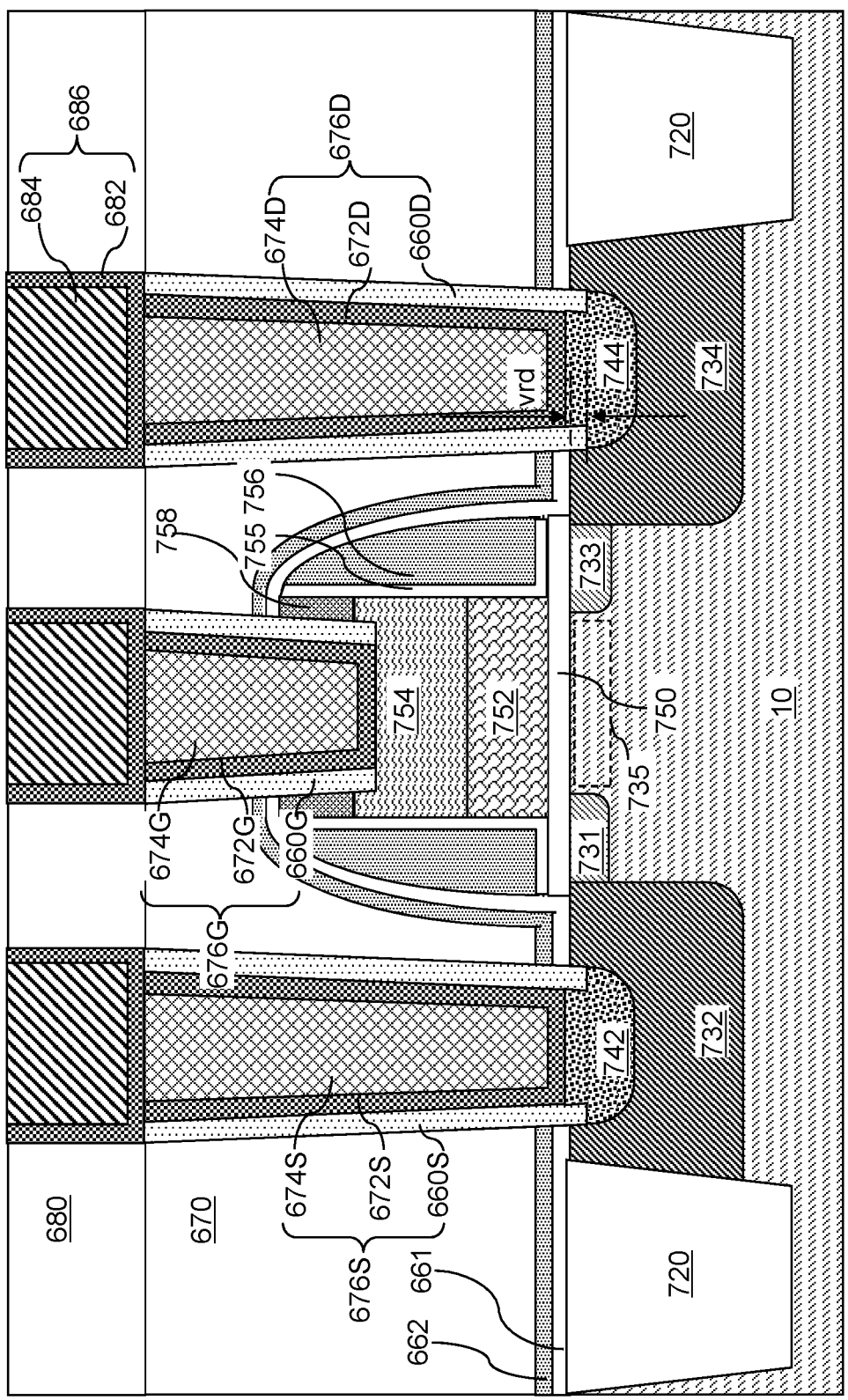
FIG. 11 is a vertical cross-sectional view of the first exemplary structure after formation of metal lines according to the first embodiment of the present disclosure.

Referring to FIG. 11, a line-level dielectric layer 680 can be deposited over the contact-level dielectric layer 670. The line-level dielectric layer 680 includes a dielectric material such as undoped silicate glass, a doped silicate glass, and/or porous or non-porous organosilicate glass. The thickness of the line-level dielectric layer 680 can be in a range from 100 nm to 300 nm, although lesser and greater thicknesses can also be employed. Line cavities are formed in the line-level dielectric layer 680 over a respective one of the composite contact via structures (676S, 676D, 676G). At least one metallic material can be deposited in the line cavities, and excess portions of the at least one metallic material can be removed from above the horizontal plane including the top surface of the line-level dielectric layer 680 by a planarization process such as a chemical mechanical planarization process. Remaining portions of the at least one metallic material in the line cavities include metal lines 686. Each metal line 686 can include a metallic liner 682 including a metallic nitride material (such as TiN, TaN, and/or WN), and a metallic fill material portion 684 including a metallic fill material (such as Cu, W, Ti, Ta, Mo, Ru, Co, and/or a combination thereof).

Figure 12:
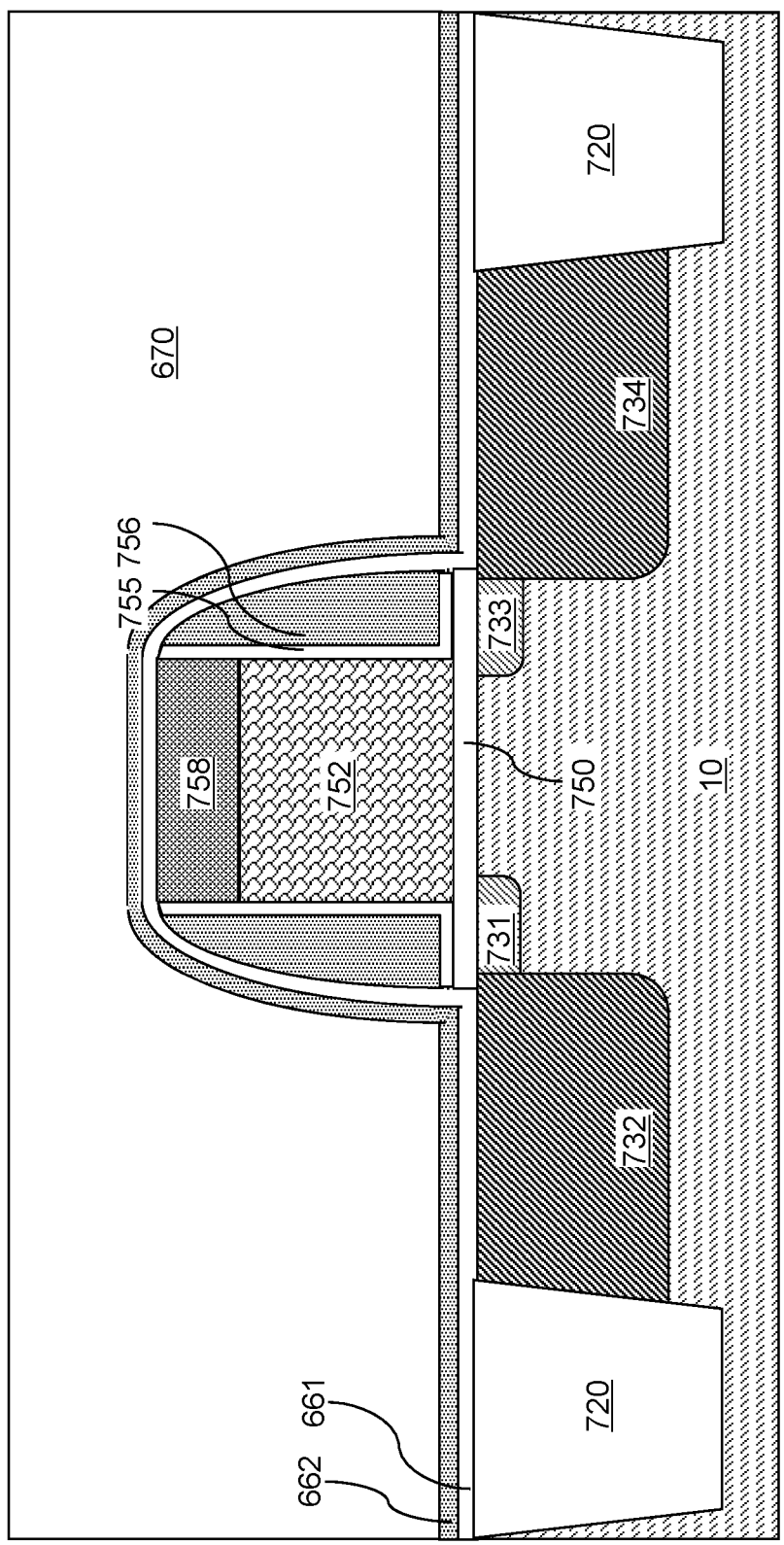
FIG. 12 is a vertical cross-sectional view of a second exemplary structure after formation of dielectric liner layers and a contact-level dielectric layer according to a second embodiment of the present disclosure.

Referring to FIG. 12, a second exemplary structure according to a second embodiment of the present disclosure can be derived from the first exemplary structure illustrated in FIG. 4 by forming a gate electrode consisting of a semiconductor gate electrode portion 752 or by forming the gate electrode in which the semiconductor gate electrode portion 752 overlies the metallic gate material layer 754, such that a metal-semiconductor alloy portion (e.g., silicide portion) is formed in an upper portion of the gate electrode. In other words, the gate electrode of the second exemplary structure includes only the semiconductor gate electrode portion 752, and does not include a metallic gate electrode portion 754, or includes the metallic gate electrode portion 754 located above the semiconductor gate electrode portion 752. The semiconductor gate electrode portion 752 can include a doped semiconductor material such as doped polysilicon. The doped semiconductor material of the semiconductor gate electrode portion 752 can have a doping of the first conductivity type or the second conductivity type. The thickness of the gate electrode (i.e., the semiconductor gate electrode portion 752) can be in a range from 50 nm to 300 nm, although lesser and greater thicknesses can also be employed.

Figure 13:
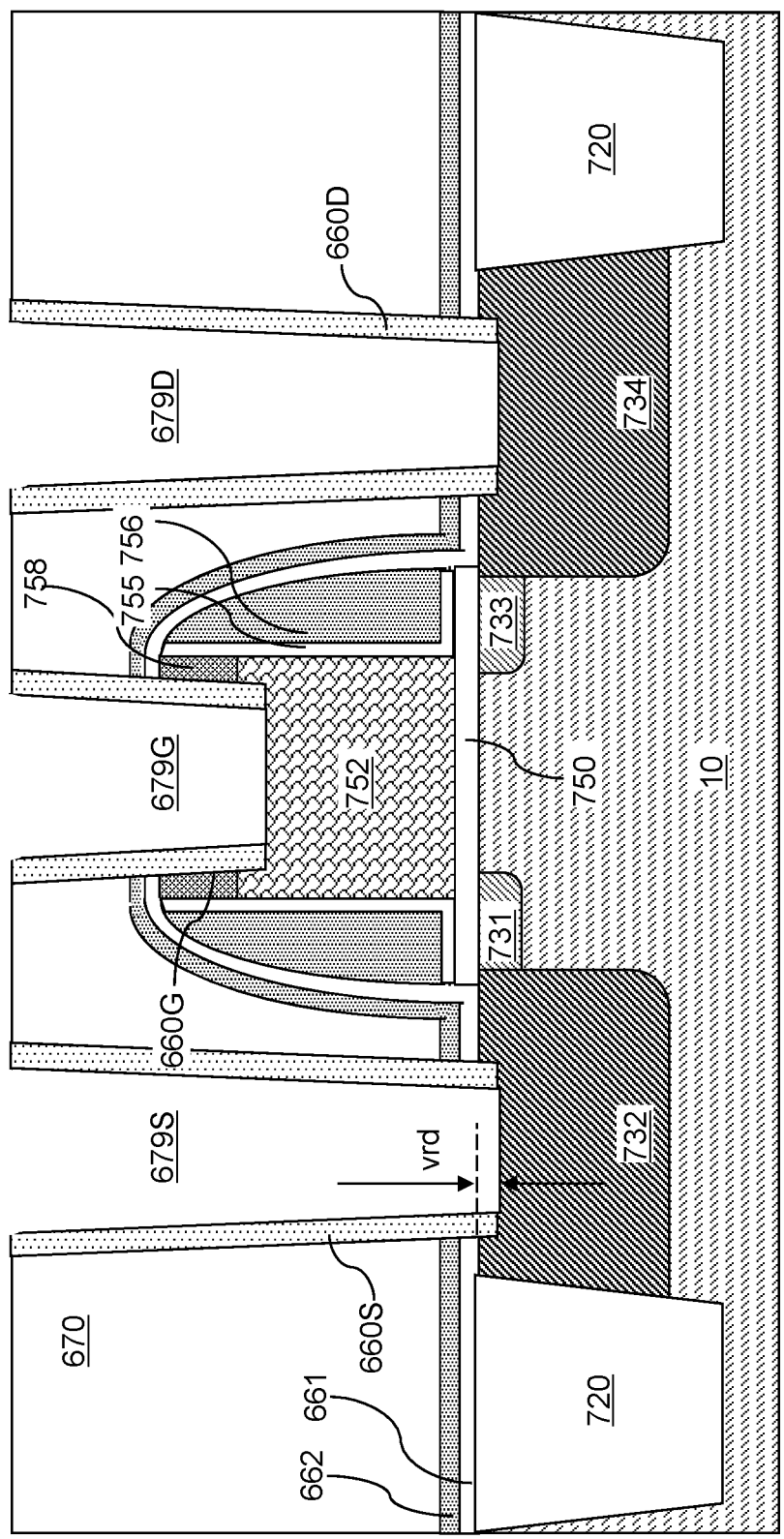
FIG. 13 is a vertical cross-sectional view of the second exemplary structure after formation of contact via cavities and tubular liner spacers according to the second embodiment of the present disclosure.

Referring to FIG. 13, the processing steps of FIGS. 5-7 can be performed to form various via cavities (679S, 679D, 679G) and various tubular liner spacers (660S, 660D, 660G). A semiconductor surface of the semiconductor gate electrode portion 752 can be physically exposed at the bottom of the third via cavity 679G. An annular bottom surface of the third tubular liner spacer 660G (which is also referred to as a gate tubular liner spacer) can contact a top surface of the semiconductor gate electrode portion 752.

Figure 14:
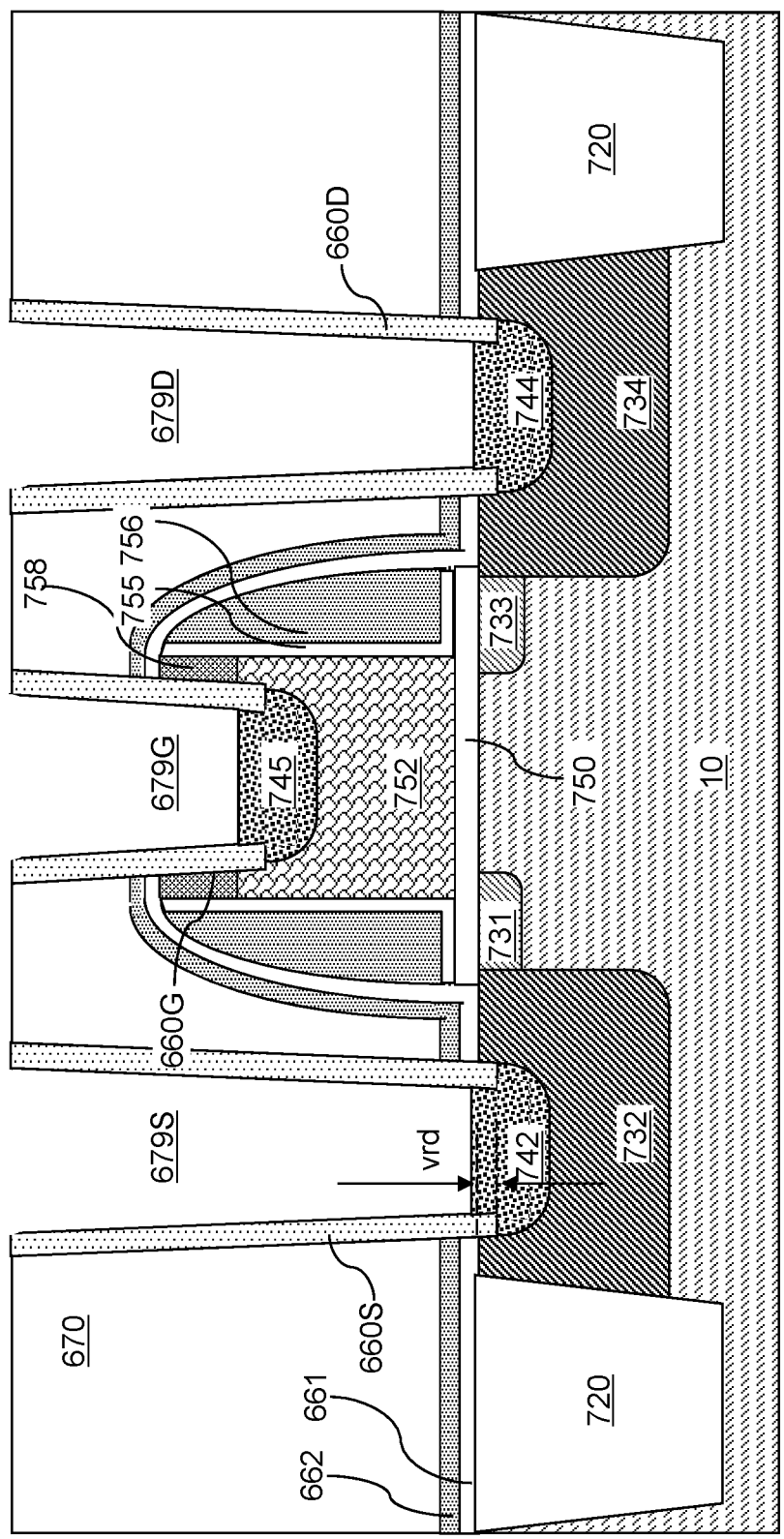
FIG. 14 is a vertical cross-sectional view of the second exemplary structure after formation of metal-semiconductor alloy portions according to the second embodiment of the present disclosure.

Referring to FIG. 14, the processing steps of FIGS. 8 and 9A or 9B can be performed to form various metal-semiconductor alloy portions (742, 744, 745). In addition to the first metal-semiconductor alloy portion 742 that is formed on the first active region (731, 732) and the second metal-semiconductor alloy portion 744 that is formed on the second active region (733, 734), a third metal-semiconductor alloy portion 745 is formed by reaction of the metal layer 640L and a surface portion of the semiconductor gate electrode portion 752. The third metal-semiconductor alloy portion 745 contacts a remaining portion of the semiconductor gate electrode portion 752. The third metal-semiconductor alloy portion 745 is also referred to as a gate metal-semiconductor alloy portion.

Figure 15:
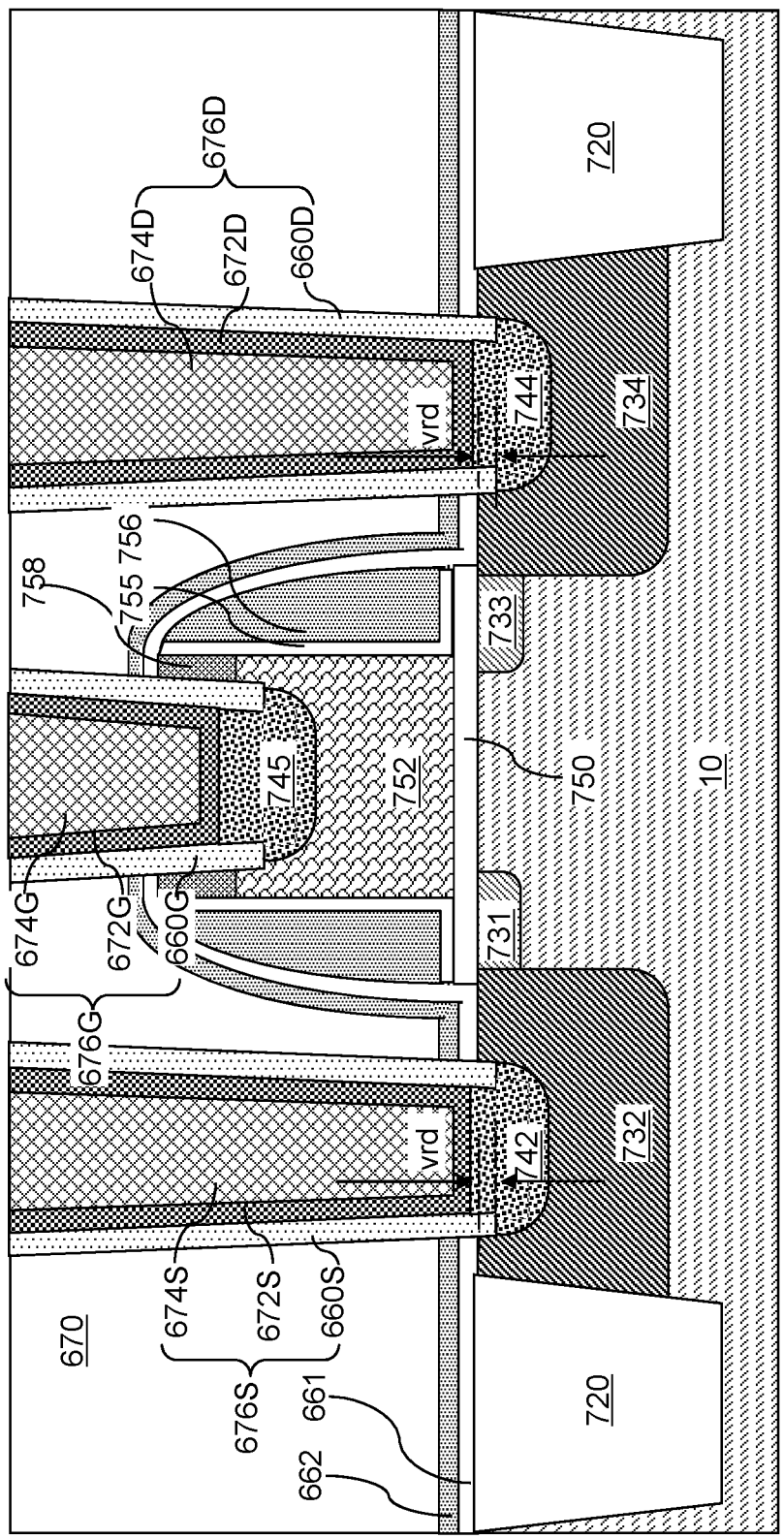
FIG. 15 is a vertical cross-sectional view of the second exemplary structure after formation of metallic nitride liners and metallic fill material portions according to the second embodiment of the present disclosure.

Referring to FIG. 15, the processing steps of FIG. 10 can be performed to form composite contact via structures (676S, 676D, 676G). The first metallic fill material portion 674S is formed within the first metallic nitride liner 672S, and is embedded in the first metallic nitride liner 672S. The first contact via cavity 679S as formed at the processing steps of FIG. 5 is filled with a first composite contact via structure 676S, which includes the first tubular liner spacer 660S, the first metallic nitride liner 672S, and the first metallic fill material portion 674S. The first composite contact via structure 676S vertically extends through the contact-level dielectric layer 670. In one embodiment, each the first tubular liner spacer 660S, the first metallic nitride liner 672S, and the first metallic fill material portion 674S can have a respective top surface located within the horizontal plane including the top surface of the contact-level dielectric layer 670.

The second metallic fill material portion 674D is formed within the second metallic nitride liner 672D, and is embedded in the second metallic nitride liner 672D. The second contact via cavity 679D as formed at the processing steps of FIG. 5 is filled with a second composite contact via structure 676D, which includes the second tubular liner spacer 660D, the second metallic nitride liner 672D, and the second metallic fill material portion 674D. The second composite contact via structure 676D vertically extends through the contact-level dielectric layer 670. In one embodiment, each the second tubular liner spacer 660D, the second metallic nitride liner 672D, and the second metallic fill material portion 674D can have a respective top surface located within the horizontal plane including the top surface of the contact-level dielectric layer 670.

A remaining portion of the metallic nitride liner layer in the third contact via cavity constitutes a third metallic nitride liner 672G. The third metallic nitride liner 672G is formed on the top surface of the gate electrode (752, 754) and on an inner sidewall of the third tubular liner spacer 660G. The third metallic nitride liner 672G contacts an inner sidewall of the third tubular liner spacer 660G, and may have a bottom surface that is located above the horizontal plane including the annular bottom surface of the gate tubular liner spacer 660G. The entirety of the bottom surface of the third metallic nitride liner 672G can contact a top surface (i.e., portion 745) of the gate electrode (754 or (752, 754)). The gate metal-semiconductor alloy portion 745 is in contact with the gate electrode 752, the gate tubular liner spacer 660G, and the third metallic nitride liner 672G, i.e., the gate metallic nitride liner.

A remaining portion of the metallic fill material in the third contact via cavity 679G constitutes a third metallic fill material portion 674D. The third metallic fill material portion 674G is formed within the third metallic nitride liner 672G, and is embedded in the third metallic nitride liner 672G. The third contact via cavity 679G as formed at the processing steps of FIG. 5 is filled with a third composite contact via structure 676G, which includes the third tubular liner spacer 660G, the third metallic nitride liner 672G, and the third metallic fill material portion 674G. The third composite contact via structure 676G vertically extends through the contact-level dielectric layer 670. In one embodiment, each the third tubular liner spacer 660G, the third metallic nitride liner 672G, and the third metallic fill material portion 674G can have a respective top surface located within the horizontal plane including the top surface of the contact-level dielectric layer 670.

Figure 16:
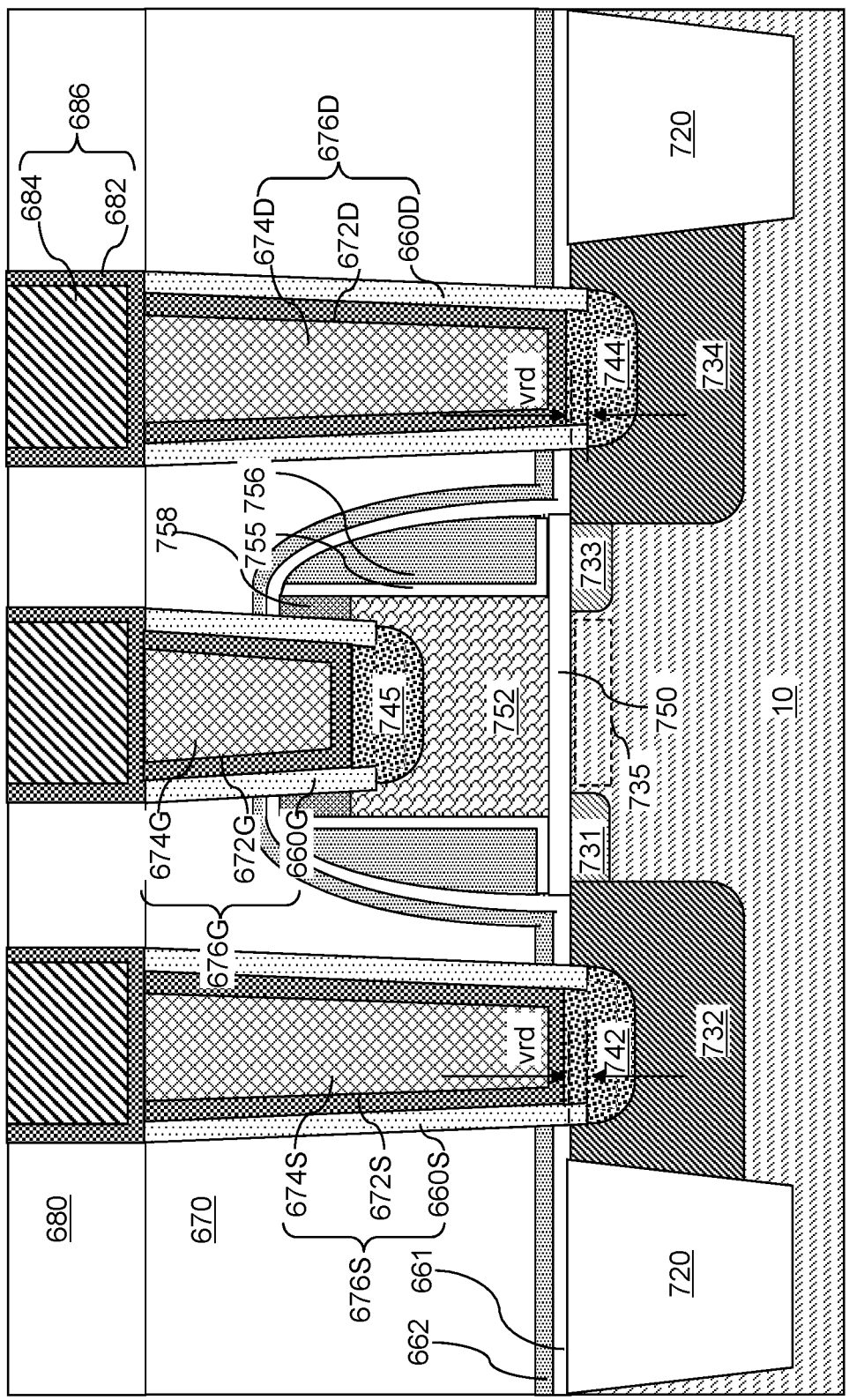
FIG. 16 is a vertical cross-sectional view of the second exemplary structure after formation of metal lines according to the second embodiment of the present disclosure.

Referring to FIG. 16, the processing steps of FIG. 11 can be performed to form a line-level dielectric layer 680 and metal lines 686. Each metal line 686 can contact a top surface of a respective one of the composite contact via structures (676S, 676D, 676G).

Referring to all drawings and according to various embodiments of the present disclosure, a semiconductor structure includes a semiconductor channel 735 of a first conductivity type located between a first active region (731, 732) and second active region (733, 734) having a doping of a second conductivity type that is opposite of the first conductivity type, a gate stack structure (750, 752, 754, 755, 756, 758) that overlies the semiconductor channel 735, and includes a gate dielectric 750 and a gate electrode (752, 754), a first metal-semiconductor alloy portion 742 embedded in the first active region (731, 732), and a first composite contact via structure 676S in contact with the first active region (731, 732) and the first metal-semiconductor alloy portion 742. The first composite contact via structure 676S comprises a first tubular liner spacer 660S including a first annular bottom surface, a first metallic nitride liner 672S contacting an inner sidewall of the first tubular liner spacer 660S and having a bottom surface that is located above a horizontal plane including the first annular bottom surface of the first tubular liner spacer 660S, and a first metallic fill material portion 674S embedded in the first metallic nitride liner 672S.

In one embodiment, an entirety of the bottom surface of the first metallic nitride liner 672S contacts a top surface of the first metal-semiconductor alloy portion 742; and the first annular bottom surface of the first tubular liner spacer 660S contacts a recessed annular top surface of the first metal-semiconductor alloy portion 742. In one embodiment, a cylindrical bottom segment of an inner sidewall of the first tubular liner spacer 660S contacts a cylindrical sidewall of the first metal-semiconductor alloy portion 742. In one embodiment, a cylindrical bottom segment of an outer sidewall of the first tubular liner spacer 660S contacts a cylindrical surface of the first active region (731, 732).

In one embodiment, the semiconductor channel 735 is located in a substrate semiconductor layer 10 which is located in or on a substrate 9, and the first annular bottom surface of the first tubular liner spacer 660S is located below a horizontal plane including an interface between the substrate semiconductor layer 10 and the gate dielectric 750. In one embodiment, the first annular bottom surface of the first tubular liner spacer 660S is vertically offset from the horizontal plane including the interface between the substrate semiconductor layer 10 and the gate dielectric by a vertical offset distance vrd in a range from 3 nm to 60 nm. In one embodiment, the first metal-semiconductor alloy portion 742 is not in direct contact with a topmost surface of the first active region (731, 732).

In one embodiment, a contact-level dielectric layer 670 can overlie the substrate, and can overlie, and can laterally surround, the gate stack structure (750, 752, 754, 755, 756, 758). The first composite contact via structure 676S can vertically extend through the contact-level dielectric layer 670. In one embodiment, the first metal-semiconductor alloy portion 742 comprises a metal silicide portion.

The semiconductor structure can comprise: a second metal-semiconductor alloy portion 744 embedded in the second active region (733, 734); and a second composite contact via structure 676D in contact with the second active region (733, 734) and the second metal-semiconductor alloy portion 744. The second composite contact via structure 676D can comprise a second tubular liner spacer 660D including a second annular bottom surface, a second metallic nitride liner 672D contacting an inner sidewall of the second tubular liner spacer 660D and having a bottom surface that is located within the horizontal plane including the second annular bottom surface of the second tubular liner spacer 660D, and a second metallic fill material portion 674D embedded in the second metallic nitride liner 672D.

In one embodiment, a gate composite contact via structure 676G can be electrically connected to the gate electrode (752, 754). The gate composite contact via structure 676G can comprise: a gate tubular liner spacer 660G including an additional annular bottom surface, a gate metallic nitride liner 672G contacting an inner sidewall of the gate tubular liner spacer 660G and having a bottom surface that is located above the horizontal plane including the additional annular bottom surface of the gate tubular liner spacer 660G (as illustrated in FIGS. 15 and 16), and a gate metallic fill material portion 674G embedded in the gate metallic nitride liner 672G. A gate metal-semiconductor alloy portion 745 can be in contact with the gate electrode 752, the gate tubular liner spacer 660G, and the gate metallic nitride liner 672G.

In one embodiment, the first tubular liner spacer 660S consists essentially of at least one dielectric material. In another embodiment, the first tubular liner spacer 660S consists essentially of a conductive metallic nitride material having a different material composition than the first metallic nitride liner 672S.

The physical distance between the metal-semiconductor alloy portions (742, 744) and the channel region can be increased relative to a comparative exemplary configuration in which the vertical recess distance vrd is zero and the tubular liner spacers (660S, 660D, 660G) are not present. Thus, the leakage current between the metal-semiconductor alloy portions (742, 744) and the channel region and the leakage current between the metal-semiconductor alloy portions (742, 744) and the gate electrode (752, 754) can be reduced relative to the comparative exemplary configuration according to embodiments of the present disclosure.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

The invention claimed is:

1. A semiconductor structure comprising:
    a semiconductor channel of a first conductivity type located between a first active region and a second active region having a doping of a second conductivity type that is opposite of the first conductivity type;
    a gate stack structure that overlies the semiconductor channel, and comprises a gate dielectric and a gate electrode;
    a first metal-semiconductor alloy portion embedded in the first active region and comprising a metal-semiconductor alloy material comprising a first elemental metal and a semiconductor material in the first active region; and
    a first composite contact via structure in contact with the first active region and the first metal-semiconductor alloy portion and comprising:
    a first tubular liner spacer including a first annular bottom surface;
    a first metallic nitride liner comprising a metallic nitride material including a second elemental metal and nitrogen atoms, and contacting an inner sidewall of the first tubular liner spacer and having a bottom surface that is located above a horizontal plane including the first annular bottom surface of the first tubular liner spacer, wherein the second elemental metal is different from the first elemental metal; and
    a first metallic fill material portion embedded in the first metallic nitride liner.

2. The semiconductor structure of claim 1, wherein:
    an entirety of the bottom surface of the first metallic nitride liner contacts a top surface of the first metal-semiconductor alloy portion; and
    the first annular bottom surface of the first tubular liner spacer contacts a recessed annular top surface of the first metal-semiconductor alloy portion.

3. The semiconductor structure of claim 2, wherein a cylindrical bottom segment of an inner sidewall of the first tubular liner spacer contacts a cylindrical sidewall of the first metal-semiconductor alloy portion.

4. The semiconductor structure of claim 2, wherein a cylindrical bottom segment of an outer sidewall of the first tubular liner spacer contacts a cylindrical surface of the first active region.

5. The semiconductor structure of claim 1, wherein:
    the semiconductor channel is located in a substrate semiconductor layer which is located in or on a substrate; and
    the first annular bottom surface of the first tubular liner spacer is located below a horizontal plane including an interface between the substrate semiconductor layer and the gate dielectric.

6. The semiconductor structure of claim 5, wherein the first annular bottom surface of the first tubular liner spacer is vertically offset from the horizontal plane including the interface between the substrate semiconductor layer and the gate dielectric by a vertical offset distance in a range from 3 nm to 60 nm.

7. The semiconductor structure of claim 5, wherein the first metal-semiconductor alloy portion is not in direct contact with a topmost surface of the first active region.

8. The semiconductor structure of claim 5, further comprising a contact-level dielectric layer overlying the substrate and overlying, and laterally surrounding, the gate stack structure, wherein the first composite contact via structure vertically extends through the contact-level dielectric layer.

9. The semiconductor structure of claim 1, wherein the first metal-semiconductor alloy portion comprises a metal silicide portion.

10. The semiconductor structure of claim 1, further comprising:
    a second metal-semiconductor alloy portion embedded in the second active region; and
    a second composite contact via structure in contact with the second active region and the second metal-semiconductor alloy portion and comprising:
    a second tubular liner spacer including a second annular bottom surface,
    a second metallic nitride liner contacting an inner sidewall of the second tubular liner spacer and having a bottom surface that is located above the horizontal plane including the second annular bottom surface of the second tubular liner spacer, and
    a second metallic fill material portion embedded in the second metallic nitride liner.

11. The semiconductor structure of claim 1, wherein the first tubular liner spacer consists essentially of at least one dielectric material.

12. The semiconductor structure of claim 1, wherein the first tubular liner spacer consists essentially of a conductive metallic nitride material having a different material composition than the first metallic nitride liner.

13. The semiconductor structure of claim 1, further comprising:
- a gate cap dielectric that overlies the gate electrode;
- an additional metal-semiconductor alloy portion embedded in an upper portion of the gate electrode; and
- a gate composite contact via structure comprising:
- a gate tubular liner spacer vertically extending through the gate cap dielectric and into an upper portion of the gate electrode and contacting an annular surface of the additional metal-semiconductor alloy portion and contacting a sidewall of a protruding portion of the additional metal-semiconductor alloy portion,
- a gate metallic nitride liner contacting an inner sidewall of the gate tubular liner spacer and having a bottom surface that is located above a horizontal plane including the annular surface of the additional metal-semiconductor alloy portion, and
- a gate metallic fill material portion embedded in the gate metallic nitride liner and having a bottom surface located below a horizontal plane including a top surface of the gate cap dielectric.

14. A method of forming a semiconductor structure, comprising:
- forming a first active region in a substrate semiconductor layer located on or in a substrate, wherein the first active region has a doping of an opposite conductivity type than the substrate semiconductor layer;
- forming a contact-level dielectric layer above the substrate;
- forming a first contact via cavity extending into the first active region through the contact-level dielectric layer;
- forming a first tubular liner spacer at a periphery of the first contact via cavity;
- forming a first metal-semiconductor alloy portion on the first active region at a bottom region of the first contact via cavity by depositing a metal layer comprising a first elemental metal on the substrate semiconductor layer, and by inducing formation of a metal-semiconductor alloy material through reaction of the first metal with a semiconductor material in the first active region;
- removing unreacted portion of the metal layer selective to the first metal-semiconductor alloy portion from inside the first contact via cavity, whereby a top surface of the first metal-semiconductor alloy portion is physically exposed;
- forming a first metallic nitride liner comprising a metallic nitride material including nitrogen atoms and a second elemental metal different from the first elemental metal directly on the first tubular liner spacer and the first metal-semiconductor alloy portion; and
- forming a first metallic fill material portion in the first metallic nitride liner, wherein the first contact via cavity is filled with a first composite contact via structure including the first tubular liner spacer, the first metallic nitride liner, and the first metallic fill material portion.

15. The method of claim 14, further comprising:
- forming a gate stack structure over a portion of the substrate semiconductor layer; and
- forming a second active region in the substrate semiconductor layer, wherein:
- the gate stack structure comprises a gate dielectric, a gate electrode, and a gate cap dielectric; and
- the contact-level dielectric layer is formed above, and around, the gate stack structure, above the first active region, and above the second active region.

16. The method of claim 14, further comprising:
- depositing a metal on the first active region after formation of the first active region; and
- forming the first metal-semiconductor alloy portion by reacting the metal with a surface portion of the first active region.

17. The method of claim 14, wherein:
- a bottom surface of the first contact via cavity is vertically recessed below a horizontal plane including a top surface of the first active region; and
- the first tubular liner spacer is formed on the top surface of the first active region;
- the first metal-semiconductor alloy portion has a bottom surface located below a horizontal plane including an annular bottom surface of the first tubular liner spacer and a top surface located above the horizontal plane including the annular bottom surface of the first tubular liner spacer; and
- the first metallic nitride liner is formed on the top surface of the first metal-semiconductor alloy portion.

18. The method of claim 14, further comprising:
- forming a liner spacer material layer on a top surface of the first active region, on a sidewall of the first via cavity, and over the contact-level dielectric layer; and
- anisotropically etching horizontal portions of the liner spacer material layer, wherein a remaining vertical portion of the liner spacer material layer comprises the first tubular liner spacer.

19. The method of claim 14, wherein the first tubular liner spacer consists essentially of a conductive metallic nitride material having a different material composition than the first metallic nitride liner.

20. The method of claim 15, further comprising:
- forming a gate contact via cavity through the contact-level dielectric layer, the gate cap dielectric, and an upper portion of the gate electrode;
- forming a gate tubular liner spacer at a periphery of the gate contact via cavity, wherein a portion of the gate tubular liner spacer contacts a sidewall of the gate electrode around the gate contact via cavity; and
- forming a gate metal-semiconductor alloy portion on the gate electrode at a bottom of the gate contact via cavity by depositing the metal layer and by inducing formation of an additional metal-semiconductor alloy material through reaction of the first metal with a semiconductor material in the gate electrode, wherein gate metal-semiconductor alloy portion contacts a lower portion of an inner sidewall of the gate tubular liner spacer.

* * * * *